United States Patent [19]

Biro et al.

[11] Patent Number: 5,648,909
[45] Date of Patent: Jul. 15, 1997

[54] STATIC TIMING VERIFICATION IN THE PRESENCE OF LOGICALLY FALSE PATHS

[75] Inventors: Larry L. Biro, Oakham; Joel J. Grodstein, Arlington; Jeng-Wei Pan, Westborough; Nicholas L. Rethman, Hudson, all of Mass.

[73] Assignee: Digital Equipment Corporation, Maynard, Mass.

[21] Appl. No.: 490,439

[22] Filed: Jun. 12, 1995

Related U.S. Application Data

[63] Continuation of Ser. No. 318,002, Sep. 30, 1994, abandoned, which is a continuation of Ser. No. 897,789, Jun. 12, 1992, abandoned.

[51] Int. Cl.$^6$ .............................. G06F 15/00; G06G 7/48
[52] U.S. Cl. .......................... 364/488; 364/489; 364/490; 364/491; 364/578
[58] Field of Search ........................... 395/500, 21, 22, 395/24, 140, 155, 161; 364/578, 488, 480, 481, 192, 188, 489, 490, 491

[56] References Cited

U.S. PATENT DOCUMENTS

| | | | |
|---|---|---|---|
| 4,263,651 | 4/1981 | Donath et al. | 364/490 |
| 4,870,561 | 9/1989 | Love et al. | 395/500 |
| 4,924,430 | 5/1990 | Zasio et al. | 364/578 |
| 4,947,365 | 8/1990 | Masubuchi | 364/900 |
| 5,081,602 | 1/1992 | Glover | 364/578 |
| 5,095,454 | 3/1992 | Huang | 364/578 |
| 5,168,441 | 12/1992 | Onarheim et al. | 395/500 |
| 5,257,201 | 10/1993 | Berman et al. | 364/489 |
| 5,257,268 | 10/1993 | Agrawal et al. | 371/27 |
| 5,282,147 | 1/1994 | Goetz et al. | 364/489 |
| 5,305,229 | 4/1994 | Dhar | 364/489 |
| 5,319,737 | 6/1994 | Reibling et al. | 395/21 |
| 5,355,321 | 10/1994 | Grodstein et al. | 364/489 |
| 5,355,322 | 10/1994 | Yamashita et al. | 364/489 |
| 5,440,675 | 8/1995 | Matsunaga et al. | 395/140 |
| 5,448,497 | 9/1995 | Ashar et al. | 364/488 |
| 5,461,573 | 10/1995 | Chakradhar et al. | 364/488 |

*Primary Examiner*—Kevin J. Teska
*Assistant Examiner*—Jacques Louis-Jacques
*Attorney, Agent, or Firm*—Lindsay G. McGuinness; Denis G. Maloney; Arthur W. Fisher

[57] ABSTRACT

In a method for improving a circuit having a logically false path through static analysis of a software model, a computer receives information describing the false path, determines a true path alternate to the false path, and analyses the circuit model with respect to the true path.

7 Claims, 10 Drawing Sheets

| NAME |
| --- |
| WORST - CASE ARRIVAL TIME |
| WORST - CASE PREDECESSOR |

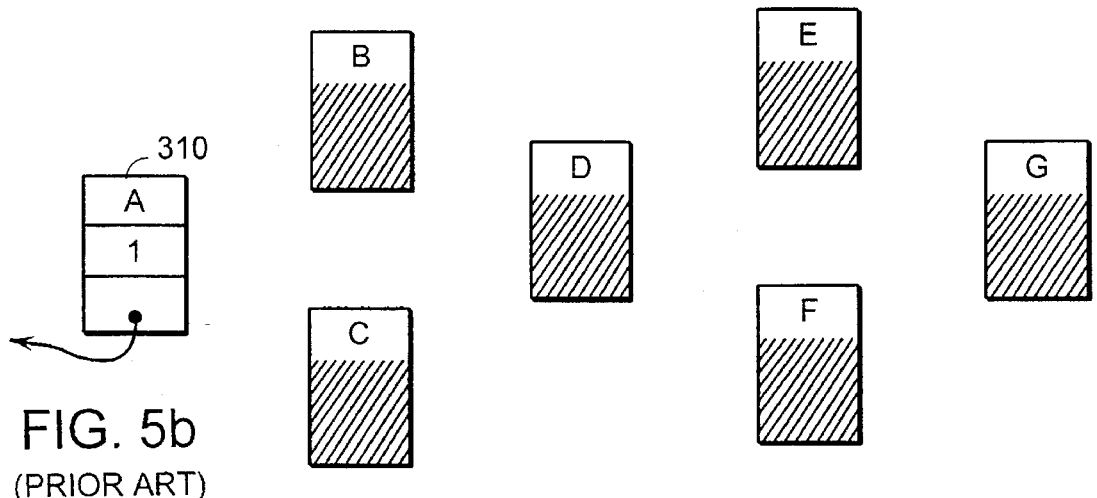
FIG. 5a
(PRIOR ART)
FIG. 5b
(PRIOR ART)
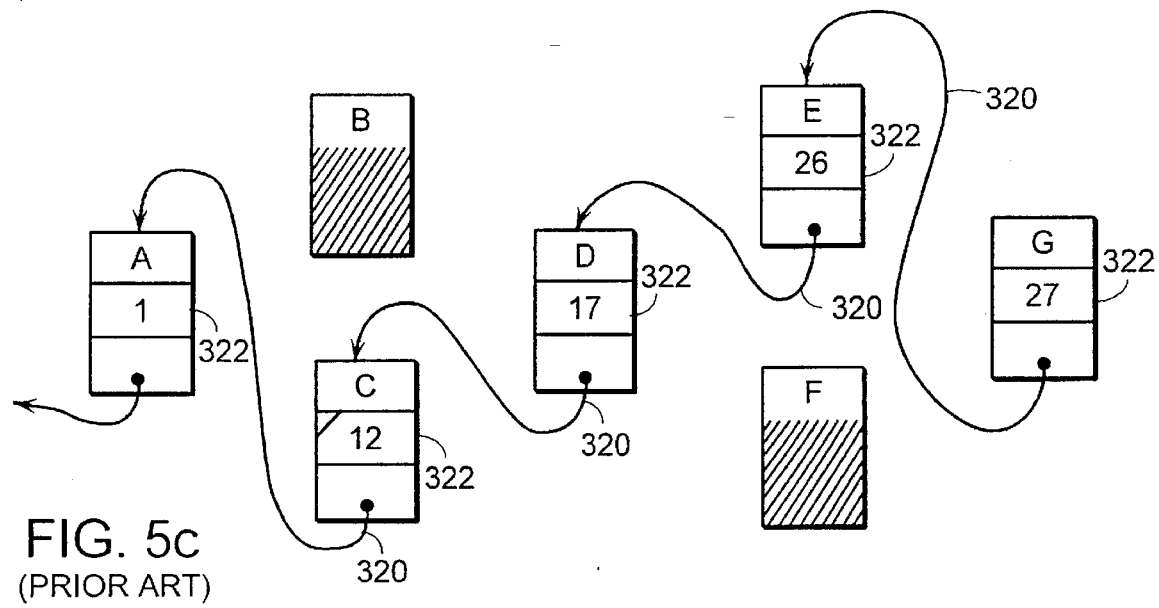
FIG. 5c
(PRIOR ART)

STATIC TIMING VERIFICATION IN THE PRESENCE OF LOGICALLY FALSE PATHS

This application is a continuation of application Ser. No. 08/318,002, filed Sep. 30, 1994 now abandoned, which is a continuation of application Ser. No. 07/897,789, filed Jun. 12, 1992 now abandoned.

REFERENCE TO APPENDIX

A source code listing of an embodiment of the invention is attached as Appendix A.

A portion of the disclosure of this patent document contains material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

BACKGROUND OF THE INVENTION

This invention relates to static timing verification of integrated circuit designs.

Prototyping a VLSI (very large scale integrated circuit) design is extremely expensive: fabbing (fabricating) a pass of a prototype full-custom VLSI chip would take several months and would cost several hundred thousand dollars. If the chip design is flawed, the chip itself is almost impossible to probe to isolate the problem and determine corrections to the design. For this reason, virtually all VLSI chips are designed and thoroughly verified by software modelling before the first actual silicon is fabbed.

A timing verifier is one program in the suite of tools used by a VLSI designer. Timing verification is the process of analyzing the circuit model to ensure that the signals propagate through the logic quickly enough to meet the timing requirements at a specified clock frequency. (A timing verifier may also may additionally include other analysis tools, for instance for race conditions or other logic problems.) Once the circuit has been largely designed using other tools of the suite, the timing verifier is used to improve it, e.g., to eliminate bottlenecks that would force the circuit to be run at a slow clock frequency. The timing verifier takes as input a description of the circuit and its interconnections, the impedances and/or loading of the wires, specifications of the devices in the logic path, and descriptions of the clocked elements, and produces as output timing of the slowest paths, i.e., the "critical paths", from which the designer can deduce the maximum clock frequency at which the circuit can be run. The designer can then redesign the critical paths to speed them up, thus speeding up the entire circuit. This process is typically iterative: the designer runs the timing verifier, and modifies his circuit design using the information generated. He repeats this process until the number of critical paths with the same timing limit is so large that reducing the time of all of them becomes impractical.

In a synchronous integrated circuit (IC) design, major signals are captured in latches at clock edges and are held at stable values when and while the clock is deasserted. The value of the signal at the output of a latch, a latched signal, is only allowed to change during the time the clock signal is asserted. During the time the clock is asserted, changes on the D input to the latch immediately propagate through the latch to the Q output; thus the clock assertion is said to make the latch transparent. The latched signals propagate downstream through combinatorial logic to other latches. The timing verifier reports any latches (or other clocked element) whose inputs are not stable in time to meet the requirements of the latch's clock.

FIG. 1 depicts a simple illustrative circuit, which will be considered under a simplified model of timing constraints and design rules. Two input signals A 100 and B 102 are latched by latches 108 and 110. Thus, signals A' 112 and B' 114 are stable except when the two latches 108 and 110 are transparent, which occurs when clocks $Ck_A$ 104 and $Ck_B$ 106 are asserted. Once A' and B' have been latched, they remain stable, and combinatorial logic $CL_1$ 116, $CL_2$ 120, and $CL_3$ 122 compute signals Y 124 and Z 126. Each of $CL_1$, $CL_2$, and $CL_3$ impose a certain delay in this computation. The downstream part of the design (not shown) relies on Y 124 and Z 126 being latched by latches 132 and 134 on clocks $Ck_Y$ 128, and $Ck_Z$ 130. Thus, $CL_1$, $CL_2$, and $CL_3$ must be fast enough to meet the setup requirements of latches 132 and 134.

FIG. 2 presents a timing diagram for the circuit of FIG. 1. The first three lines show the clocks $Ck_A$ 104, $Ck_B$ 106, $Ck_Y$ 128, and $Ck_Z$ 130. In this example, A and B are latched on the same clock. Signals A and B must be stable far enough before the falling edge of $Ck_A/Ck_B$ 206 to accommodate a "setup time" 208, a characteristic of latches 108 and 110. Once latches 108 and 110 become transparent during $Ck_A/Ck_B$ 204, (assuming that the setup time and the data-to-output time of the latches are equal) signals A' and B' are allowed to transition until they are latched on the falling edge of $Ck_A/Ck_B$ 206. A' and B' drive $CL_1$, $CL_2$, and $CL_3$, which in turn produce signals X, Y, and Z. Under the simplified timing rules, the timing constraints of the circuit are satisfied if the propagation delay 208 of latch 108 plus the propagation delays through $CL_1$ 216 plus $CL_2$ 220 plus the setup time 232 of latch 132 is less than the time from the fall of clock $Ck_A/Ck_B$ to the fall of clock $Ck_y$ 228, and if the propagation delay 208 of latch 110 plus the time delay through $CL_1$ 216 plus $CL_3$ 222 plus the setup time 234 of latch 134 is less than the time from the fall of clock $Ck_A/Ck_B$ to the fall of clock $Ck_Z$ 230. The paths of A'-$CL_2$-Y and B'-$CL_3$-Z must also meet the timing requirements of latches 132 and 134, but these will be trivially satisfied because they are clearly faster than paths A'-$CL_1$-X-$CL_2$-Y and B'-$CL_1$-X-$CL_3$-Z. When all these conditions are satisfied, the circuit is said to pass timing verification.

If the circuit fails timing verification, the timing verifier will report the critical paths that failed. Either the logic on the slow paths needs to be redesigned to be faster, or the clock frequency needs to be slowed down to accommodate the timing of the circuit.

Timing verifiers operate on one of two general paradigms: dynamic or static.

In dynamic timing verification, the circuit design is simulated through time. The engineer must determine model input stimuli with which to drive the circuit model, called test vectors. Applying dynamic timing verification to the sample circuit to FIG. 1, the timing verifier would successively apply twelve stimuli where either A or B or both undergo transitions: AB→AB={00→01, 00→10, 00→11, 01→00, 01→10, 01→11, 10→00, 10→01, 10→11, 11→00, 11→01, 11→10 } and run a loop to simulate time, during which model clock $Ck_A/Ck_B$ would undergo several transitions. The circuit model would be operated through time to see at what time signals Y and Z stabilize. Dynamic timing verification is effective in that it is capable of diagnosing all timing problems, at least for the test vectors applied. But in modern circuit designs, the super-exponential combinatorics on tens of thousands of signals is fatal to the dynamic approach: there simply isn't time to test all possible combinations of inputs (most of which would never arise in actual operation), nor for a human to filter out a set of meaningful test vectors that will test all the effective paths.

In the second paradigm, static analysis, there is no loop simulating the passage of time. Static analysis is to dynamic analysis as theorem proving is to case analysis: instead of attempting to simulate a "large enough" number of specific cases, a static timing verifier "reasons" about the circuit model and draws inferences about whether the circuit will meet its timing constraints. This generally involves analyzing every node—i.e., every wire—in a circuit and calculating transition times based on the arrival time of inputs and the propagation delay through the structures. As the times of the transitions of the inputs to a node are analyzed, only the latest transition (in time) is saved, and the algorithm immediately stops tracing any path that is known not to be the worst case. This process, called information pruning, is required to keep the execution times reasonable.

One known algorithm for static timing verification is a depth-first search (DFS) of the circuit starting at each signal guaranteed on a clock edge, labelling each node with the currently best-locally-known worst-case timing information. After all nodes have been labelled, a second pass examines all timing constraints to tell the designer whether the circuit as a whole meets its timing constraints.

Consider the circuit of FIG. 3, in which a first stage of the circuit has two paths of different delay times, which join at a multiplexer. The output of the multiplexer fans out in a second stage of two paths of different delay times, which are joined at a second multiplexer. The DFS algorithm represents each node of a circuit by a data structure as shown in FIG. 4. The node has a name, a "worst case arrival time," and a pointer to the node that drove this worst-case transition.

FIGS. 5a–e depict a DFS analysis of the circuit of FIG. 3: FIG. 5a shows a time-sequence of stack states, and FIGS. 5b–e show a time sequence of states of data structures.

In the DFS algorithm, the graph of the nodes of the circuit is walked in a depth-first order. The algorithm's walker maintains a current "arrival time," and a stack of nodes. (Since this is a static analyzer, note that the "arrival time" does not "tick" off time incrementally, it moves forward and back by the discrete amounts of delay of the logic walked.) The DFS walker pushes nodes onto the stack as it traces paths downstream, and pops them as it unwinds back upstream. The walker increments its arrival time as it walks downstream through logic by the time delay of the logic, and decrements it the same amount as it unwinds back. As the algorithm pushes each node, if the walker's arrival time is later than the current "worst case arrival time" (or simply ".time") of the node, then the node is updated with the value of the DFS arrival time, and the node's "worst case predecessor" (or simply ".predecessor") is pointed at the predecessor node down which the DFS walk came, and the DFS continues down the successor nodes. If the DFS arrival time is equal to or earlier than the current node's worst case arrival time, the probe of this path is abandoned, and the node is popped off the stack.

In FIG. 5a, each column depicts a step 300 identified by number, and the value of the DFS arrival time 302 during that step. The state of the DFS stack 304 is also shown, with the top of the stack in bold. The term "labelled" is used to describe information permanently (though overwritably) stored in the representation of the circuit. "Unvisited" is used in a local sense: a node is unvisited if it as not been visited via the current path, even if it has been previously visited via a different path.

step 1: FIG. 5b shows the configuration of the nodes for the circuit of FIG. 3 as the algorithm visits the first node of the circuit, node A 310. All the node names have been filled in. A.predecessor and A.time have been filled in (by the process about to be described in detail).

step 2: Assume that A's list of successor nodes is ordered such that the algorithm visits C, then B. Thus, the algorithm walks to node C. Since the logic connecting A to C, $CL_2$, consumes 11ns, the DFS algorithm carries the arrival time 12 as it arrives at C. The algorithm, finding C not already labelled, labels C.time with 12 and points C.predecessor to A.

step 3: The only successor of C is D, through logic consuming 1ns, so the algorithm proceeds to D and sets D.time 13 and points D.predecessor to C. Assume that D's list of successor nodes is ordered such that the algorithm visits node E, then F.

step 4: Node E is filled in with time 26 and predecessor D.

step 5: Node G is filled in with time 29 and predecessor E. The walk would continue downstream from node G.

The intermediate state after step 5 is shown in FIG. 5c. The "worst-case arrival times" 322 have been filled in with a preliminary estimate of the latest transition time. The .predecessor pointers 320 show a preliminary estimate of the critical path to G, A-C-D-E-G. After the algorithm has visited all downstream logic and popped its stack to G:

step 6: DFS pops its stack to back E. E has no unvisited successors.

step 7: DFS pops its stack back to D. D has an unvisited successor, F.

step 8: Node F is filled in with time 32 and predecessor D.

step 9: When DFS arrives at node G with arrival time 33, it finds the node already labelled, but with a time earlier than the current DFS arrival time. Thus, G is updated with time 33, and G.predecessor is updated to point to node F. Note that pointing G.predecessor from E to F "prunes" from the graph all analysis downstream of E that was computed between steps 5 and 6. The algorithm has proved that E cannot possibly be on the critical path to G nor any node downstream of G. Because G has been relabelled, the nodes downstream of G must be walked again to have their times updated.

The intermediate state after step 9 is shown in FIG. 5d.

step 10: DFS pops its stack back to node F.

step 11: DFS pops its stack back to node D. D has no unvisited successors.

step 12: DFS pops its stack back to node C.

step 13: DFS pops its stack back to node A. The next unvisited successor of A is B.

step 14: B is labelled with time 8 and predecessor A.

step 15: DFS arrives at node D with arrival time 9. The arrival time is earlier than the current time of node D; thus, the algorithm stops probing along this path: all paths downstream of node D through node B are also said to be "pruned." By the same reasoning used in step 9, the algorithm has proved that the critical path to all nodes downstream of D must pass through C, not B.

step 16: DFS pops its stack back to node B.

step 17: DFS pops its stack back to node A. Node A now has no unvisited successors.

Finding no unvisited successors of A, the DFS algorithm is complete. The result of the algorithm is the critical path graph of FIG. 5e. For instance, the critical path to node G can be discovered by tracing the .predecessor pointers from a node; e.g., the critical path to G is seen to be A-C-D-F-G.

The critical path graph will be of the form of a forest of trees, each tree rooted at one of the input nodes or interior latches. Paths B-D and E-G have been pruned; no larger path that would have used these paths will be analyzed.

There may be multiple critical path graphs built for a single circuit, for instance one for a rising clock edge and one for a falling edge. Each node will have at most a single out-edge pointing to the latest-transitioning driver node for the given clock edge (or to one of several equally-late transitioning). The critical path graphs superimpose without effect on each other. Without loss of generality, the disclosure will discuss single critical path graphs.

Once the timing verifier has identified the critical path to every node, the designer will redesign parts of the circuit to speed up the logic on the critical path, and then run the timing verifier again. If the designer successfully speeds up a structure on the critical path, subsequent runs of the timing verifier on the altered circuit will very likely produce a different critical path graph.

Pruning is essential to making static analysis practical. A naive DFS walk of a circuit would take time exponential in the number of edges between the nodes of the circuit. Though it is possible to construct artificial examples in which DFS algorithms, even with pruning, exhibit exponential time complexity, in practice pruning reduces the time complexity from exponential to nearly linear. With pruning, a single run of DFS and violation sorting of a full microprocessor design can take about fifteen CPU minutes. Without pruning, such analysis would be infeasible.

In dynamic timing verification, the designer creates test vectors that exercise active, meaningful paths of the circuit. Static timing verification, by its nature, ignores the designer's logical intent and tests all paths through the circuit. The blessing of this more complete coverage is also a curse: unused, meaningless paths that will never be exercised during actual use of the circuit are also tested.

Consider again the circuit of FIG. 3. All further discussion in this disclosure will assume that X and Y are mutually exclusive, rendering the path A-C-D-F-G logically impossible. This could occur for a number of reasons, including:

1. dependencies in the logic generating nodes X and Y,
2. architectural constraints affecting X and Y,
3. logic A, B, E, and F is shared for differing functions.

Proper timing verification of this circuit should discover that the worst-case timing of node G is 29ns along path A-B-D-F-G instead of 33ns along A-C-D-F-G. The path A-C-D-F-G is called a "false path" or "logic exclusivity." However, the known DFS with standard pruning will prune node D such that only the C-D path remains (i.e., the B-D path is pruned away). Because node D does not have any path data structures pointing to node B, the true critical path A-B-D-F-G will not be generated by the tool. This can result in a number of undesired results including:

1. Inaccurate timing estimates for logic containing false paths. The timing verifier can generate overly-optimistic or overly-pessimistic estimates.
2. Pruning eliminates the edges forming the real critical path; the real critical path is left unanalyzed.

Existing timing verifiers handle false paths by requiring the user to manually insert timing estimates on the false path portion of the circuit, by executing multiple verification passes of the circuit or by manually annotating them and eliminating them altogether.

In manual insertion of timing estimates, the user specifies either absolute or relative timing estimates for nodes that are part of a false path. For instance, in the example, the user would annotate node F with time 32. The manual timing estimates method has the following characteristics:

1. A manual step introduces risk that incorrect timing will be specified,
2. A user may not have an accurate timing estimate for the node needing the timing,
3. If the circuit design is modified, the manually-specified timing estimate must be manually updated.
4. The manually-specified timing estimate will be invalid if the cycle time is varied.

In another known technique, called "case analysis," the user specifies the valid combinations of certain input nodes. The verifier then uses these values to perform multiple passes through the network, much in the manner of dynamic timing verification. In the example of FIG. 4, if nodes X and Y are known to be exclusive, then a case analysis approach would call for three separate passes to be performed on the circuit: one with X deasserted and Y asserted, one with X asserted and Y deasserted and finally one with both X and Y deasserted. This does indeed allow the verifier to ignore the false path from A to F. However, 2n–3n passes of analysis are required, where n is the number of false path relationships in the network. Case analysis increases exposure to exponential time complexity. The output from the multiple runs must be merged into a single result.

In yet another prior art technique, the circuit designer specifically annotates his circuit model with information indicating the false paths, directing the timing verifier to ignore those paths in its analysis. For instance, for the circuit of FIG. 3 (with the assumption that X and Y are mutually exclusive), the designer might add the statement path_logically_impossible C,F to his model, indicating that all paths that include both C and F are false paths. In this technique, an additional check is added as each node is pushed onto the DFS stack: the algorithm checks that the node is not the downstream node of any "path_logically_impossible" pair. If it is, and the upstream node of the pair is on the stack, then the path is abandoned.

Referring to FIG. 6a and applying this algorithm to the same example circuit of FIG. 3, steps 1–7 proceed exactly as in steps 1–7 of FIG. 5a–5c. In step 8, the DFS finds that the current node, F, is indeed the downstream node of an impossible path, and that the upstream node of the path, C, is on the stack. The algorithm abandons the walk and pops node F—having visited F without processing it, and without labelling nodes F and G with the edges 330 of FIGS. 5d and 5e. The visit of node G of step 9 of FIG. 5a never occurs. Steps 9–15 of the modified algorithm proceed exactly as in steps 11–17 of FIG. 5a. The result is the critical path graph of FIG. 6b. Node G has been labelled with time 27, but node F appears unvisited: no critical path to F has been calculated. Worse, the algorithm has failed to find the real critical path of the circuit, A-B-D-F-G. The too-optimistic timing estimate on node G, 27, masks the real worst-case arrival time of 29. This error may lead to catastrophic failure of the circuit.

SUMMARY OF THE INVENTION

The invention provides static timing verification of circuit structures in the presence of logically false paths. To be effective on a circuit with false paths, a timing verifier must be able to identify (possibly with user assistance) the false paths and eliminate them from consideration, limiting the analysis to the paths that in fact contribute to the circuit's function and performance.

In general, in one aspect, the invention provides a method for improving a circuit having logically false paths through static analysis of a software model. In the invention, a computer receives information describing the false path, determines a true path alternate to the false path, and analyzes the circuit model with respect to the true path.

An advantage of the method is that it provides accurate timing verification of large VLSI designs containing false paths. The method offers significant run time advantage—up to 50 times—over tools that are based on case analysis techniques. The method generates a single result; there is no requirement for merging the results of multiple analyses. The manual annotation of the model is symbolic, so that the timing verifier can automatically maintain consistency in subsequent runs. These advantages are magnified in a large design, for instance a large microprocessor, where the false paths can number in the hundreds.

Other advantages and features of the invention will become apparent from the following description and from the claims.

BRIEF DESCRIPTION OF THE DRAWINGS

FIGS. 5a–5e illustrate a time sequence of states during timing verification.

FIGS. 19a–b illustrate a time sequence of states during timing verification.

DESCRIPTION OF THE PREFERRED EMBODIMENT

A timing verifier using the invention will typically be run iteratively. A run using the simple pruning method will print the false path as the critical path of the circuit. The designer, after manual analysis, will determine that the reported critical path is really a false path, and will annotate his design to so inform the timing verifier. In subsequent runs, the timing verifier will use a selective pruning method to remove the false path from consideration, and to verify the discovered true path.

The output of a timing verifier using the invention is presented in the same format as the output of the prior art timing verifiers. The output will be different in that, even in the presence of user-declared false paths, the timing verifier will analyze and print all significant real paths, i.e., the masking effect will not occur.

The invention has been implemented as a modification to NTV, a timing verifier in internal use at Digital Equipment Corporation. NTV is written in the C language. The implementation of the invention centers in improvements to the data structures, and modifications to the DFS routines.

Introducing this feature into a static timing verifier requires changing a few of the foundation assumptions on which the verifier is built, and implementing code modifications throughout the verifier to account for these changed assumptions.

Past static timing verifiers have assumed that the time of the worst-case output from a node would depend on the time of its worst-case input. This assumption is invalidated in any verifier that addresses the false path issue; for instance, the worst-case output of node F of FIG. 3 depends on the second-worst transition time of input node D.

Past static timing verifiers have been constrained to model a fixed number of transitions on each node per clock cycle. Timing verifiers using the invention must track multiple transitions per node. The number of transitions of a node cannot be predicted before the analysis begins, so the data structures must allow for a varying number of transition labels per node.

In NTV, the "worst case time" and "worst case predecessor" are de-embedded from the node structure into a "transition" data structure, so that a node may be labelled by multiple transitions. Each transition data structure has an "owning" node (indicated by the name of the node in parentheses), and the worst-case time and predecessor for the transition. The time of each transition is expressed as a (phase boundary, offset relative to the phase boundary) ordered pair.

Figure 1:
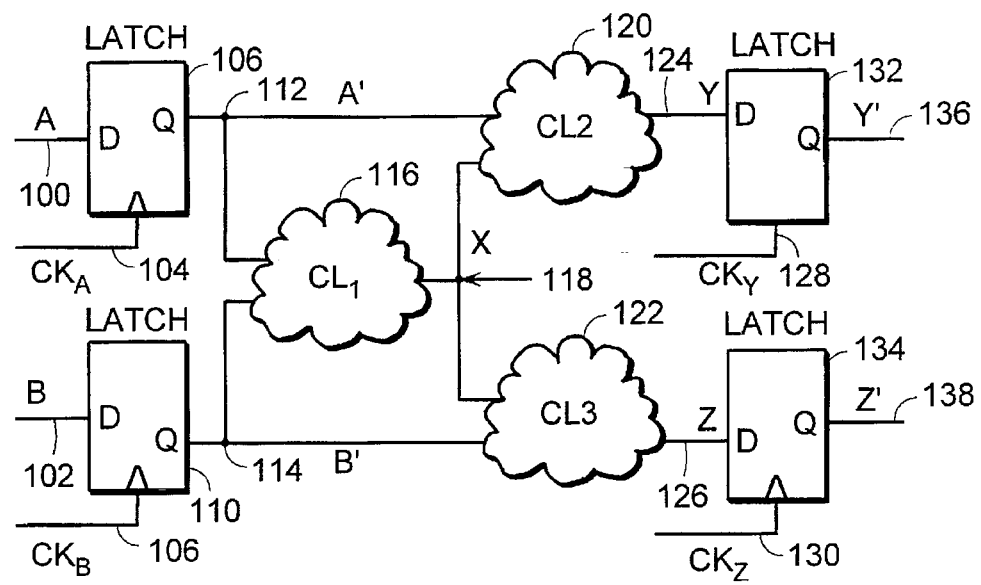
FIG. 1 is a schematic diagram of a hypothetical circuit.
Figure 2:
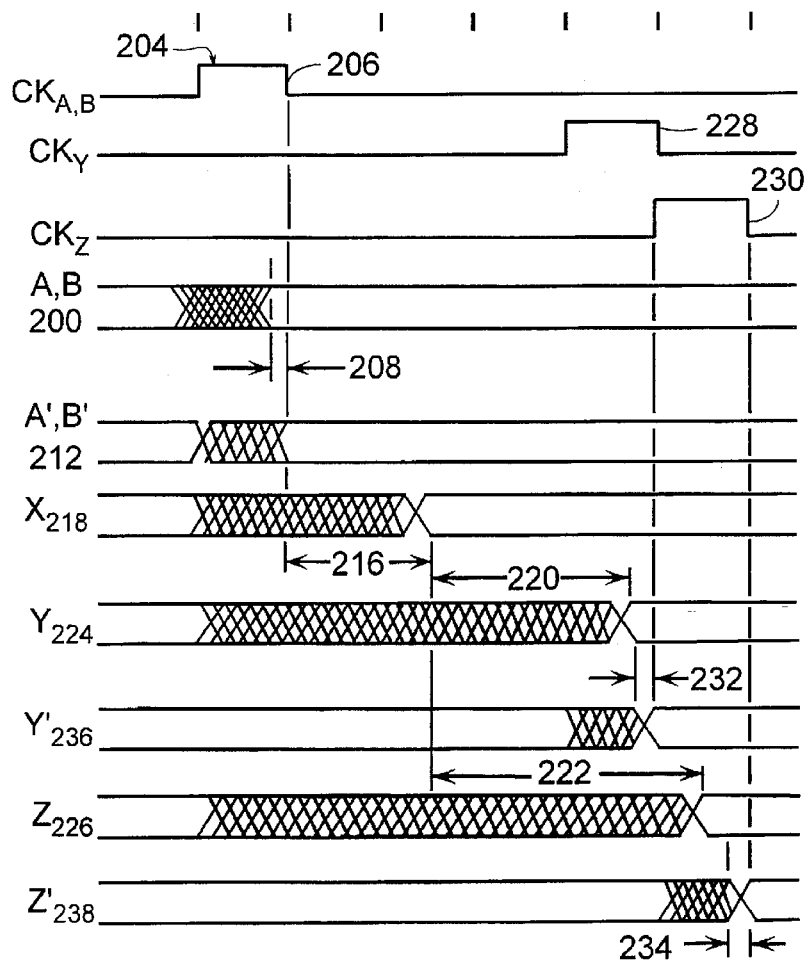
FIG. 2 is a timing diagram for the circuit of FIG. 1.

Static timing verifiers consider clocks as a distinct class of inputs from all other signals. Clocks are treated as independent variables—as the givens of the system. The times of all other signals are stated relative to the clock's phase boundaries. In NTV, the base case for the DFS' recursion is a "primary input node," the nodes at the "left edge" of a circuit. The user must specify timing information for these primary input nodes. The circuit's actual clock signals, for instance $Ck_A$ and $Ck_B$ of FIG. 1, are primary input nodes. The timing of the clocks is known to the designer at the clock generators, and is specified relative to the phase boundaries of a "mathematically ideal" clock. The timing verifier propagates the clock signals through the clock logic of the circuit, applying the appropriate delay relative to a phase boundary at each of the clock buffers. As a simplification, the invention is described in terms of a scalar time relative to a zero base.

The DFS walker carries a current "arrival time." The arrival time is computed by adding the time delay of the logic last walked through to the time of the transition of the node in the next-to-top slot of the stack.

The algorithm is modified: instead of the prior art's all-or-nothing decision to trace or prune, the modified algorithm traces some paths speculatively. Some paths that the old algorithm would have chosen to abandon outright are traced using transition data structures in a stack, rather than building the transitions in permanent memory. If the algorithm determines that the speculative path is a "true path" parallel to a false path, it copies the transitions from the stack to permanent memeory to annotate the true path.

Somewhat simplified (to remove fields for other NTV features not related to the invention), the data structures of the NTV implementation of the invention are presented in the following tables. Table 1 is the "transition" data structure, table 2 is the "node" data structure, and table 3 is the data structure for the stack entries.

TABLE 1

The transition data structure:

```
struct transition {
    struct node       *node;         /* Node that the transition is */
                                     /* on */
    int               arrival_time;  /* the time stamp. */
    struct transition *predecessor;  /* latest-transitioning driver */
    struct transition *next;         /* Next transition for "node" */
};
```

Figures 6A, 6B, 7A, 7B, 7C:
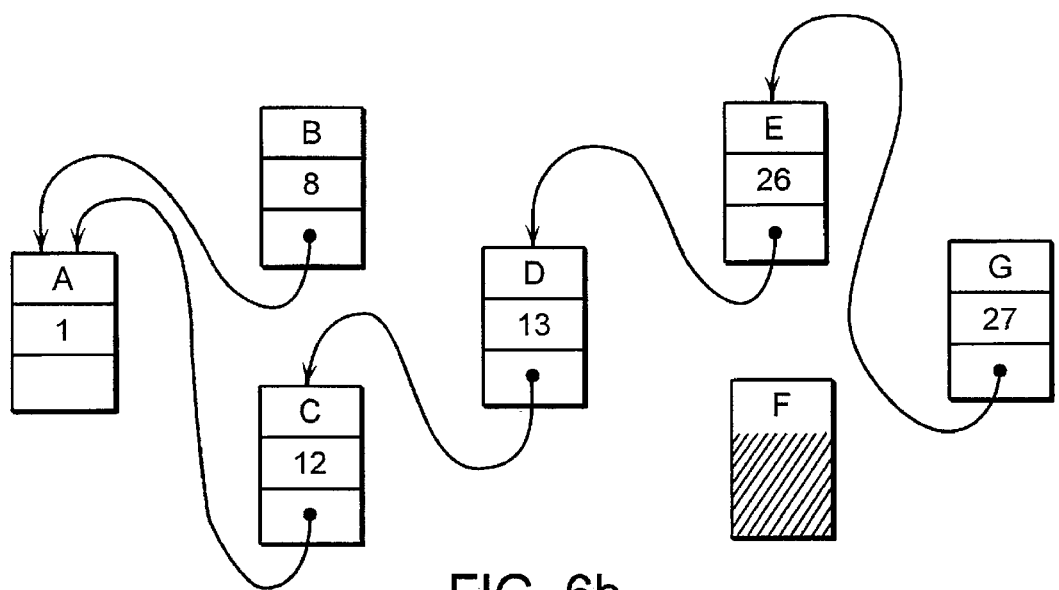
FIGS. 6a–6b illustrate a time sequence of states during timing verification.
FIGS. 7a–7c are data structure diagrams.

Member ".node" indicates the owning "struct node" (see table 2). Member ".arrival time" labels the "worst case transition time." Member ".predecessor" is the "worst case predecessor," and points to the latest-transitioning "struct transition" driving "node." Member ".next" threads the linked list of "struct transitions" on the node. A diagram of the transition data structure is shown in FIG. 7a.

TABLE 2

The node data structure:

```
struct node {
    struct name       *node_name;        /* name of the node */
    struct device     *Successors_head;  /* list of consumer dev's */
    struct transition *transitions_head; /* list of transitions */
}
```

Member ".node_name" is a pointer to a string naming the node. Member ".successors_head" is the head of the linked list of the devices driven by the node. The devices, in turn, will point to the nodes immediately downstream of the node. Member ".transitions_head" is the head of the linked list of transitions owned by the node. A diagram of the node data structure is shown in FIG. 7b.

TABLE 3

The DFS stack data structure

```
struct dfs_stack_item {
    struct node_rec   *node;           /* data node pointer */
    struct device_rec *mos;            /* the device driving */
                                       /* "node" */
    int               arrival_time;
    struct transition *transition;     /* new transition */
    struct transition old_transition;  /* restore path when false */
                                       /* path */
    unsigned          unreal_transition : 1;
};
```

Figure 5D:
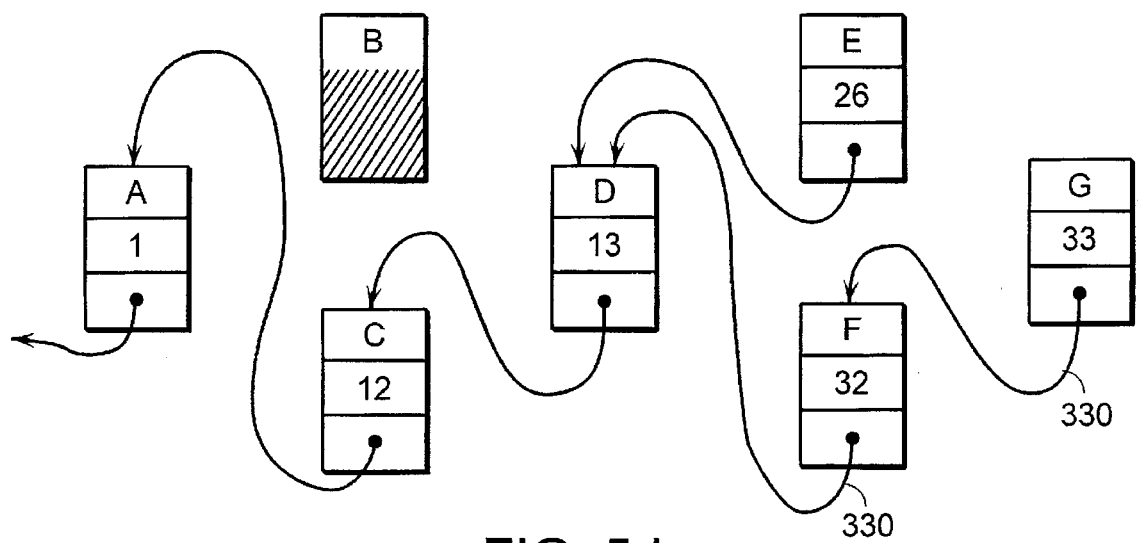
Figure 5E:
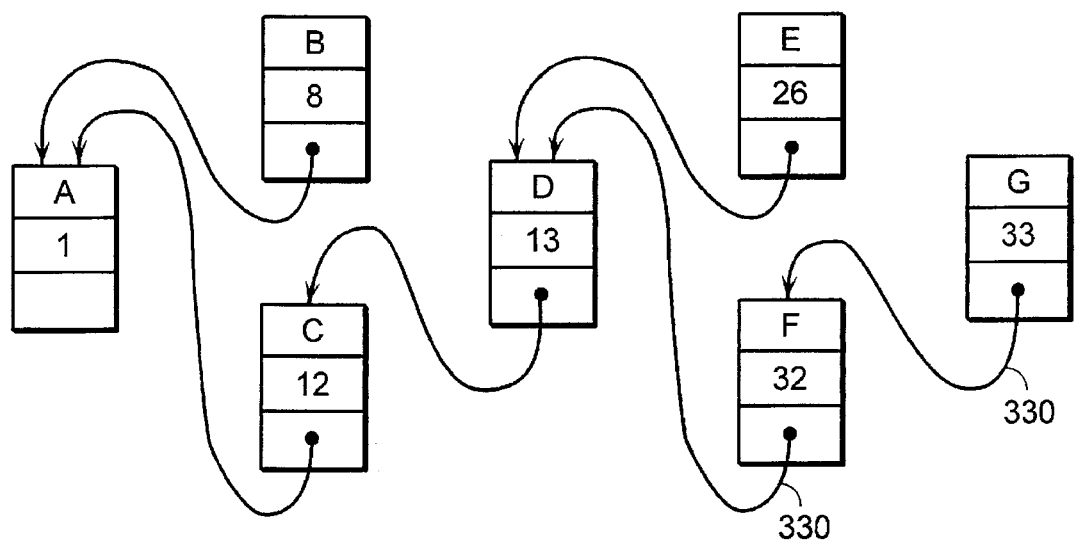
Figure 8A:
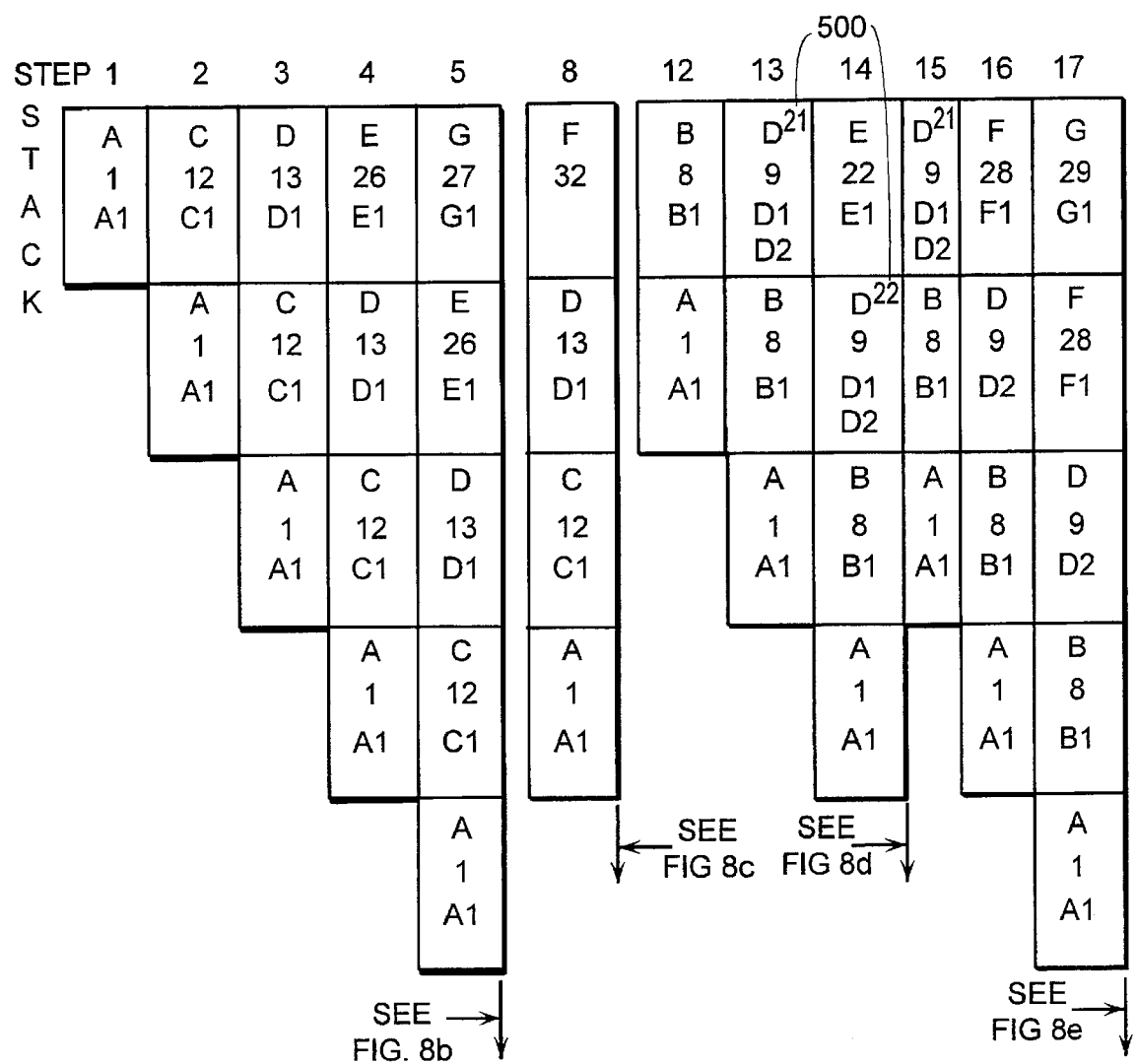
FIGS. 8a–e illustrate a time sequence of states during timing verification.

Member ".node" is a pointer to the node shown in the stack of FIGS. 5a, 6a, and 8a. Member ".mos" is the device driving ".node." ".arrival_time" is the value of the arrival time maintained by the algorithm. Member ".transition" is a pointer to a transition data structure that has been committed to permanent storage. Member ".old_transition" is a transition data structure that is part of the stack, and thus in temporary storage. ".old_transition" is used while the algorithm is speculatively tracing a path that would have been pruned in the prior art algorithm, but which is speculatively traced because it may turn out to be the critical path parallel to a false path. Member ".unreal_transition" is a true/false flag used when the algorithm is speculatively tracing a path downstream of a node that has been determined to lie on a false path. If .unreal_transition is true, the .transition member should be ignored in deference to the .old_transition member. A diagram of the node stack structure is shown in FIG. 7c.

An overview of the process is presented below in Table 4, and the detailed pseudocode is provided in attached appendix B.

TABLE 4

Modified DFS algorithm: an overview

```
IF the current node is the downstream member of a "PLI" pair
    AND the mate is on the stack
THEN
    BEGIN
        abandon trace.
        mark all interior nodes of the false path.
        pop back one node.
    END
IF the current arrival time is the worbt case time for the node
THEN
    BEGIN
        whether or not this node is a flase path node is irrelevant--
            the speculative path must be the real path.
        FROM current node BACK TO where speculative trace began DO
            pull speculative transitions out of stack into permanent
                memory
        END DO
        continue tracing, noting that trace is not speculative
    END
ELSE /* the current arrival time is not the worst case */
    BEGIN
        IF current node is marked as an interior node of a false path
        THEN
            BEGIN
                note that this step of the trace is speculative.
                Algorithm will continue speculatively tracing until the
                    current node is NOT an interior node of a false path.
            END
        ELSE
            Abandon trace -- this path can be pruned.
        END
Recursive call: if trace is not abandoned, trace the downstream
    successor nodes
```

In line 400 of the code shown in Table 4, the algorithm tests whether the current node is the downstream member of any "path_logically_impossible" pair. If so, the algorithm walks through the stack back to the upstream member of the pair, marking the nodes between the endpoints of the false path ".false_path". Lines 409, 412, and 423 ensure that when execution reaches line 426, the arrival time is not the worst, but that the current node is on a false path. The algorithm records that the trace is speculative, and proceeds to the successor nodes. In line 414, the algorithm has found that the speculative path was a true path, and so the speculative path is copied into permanent memory.

Referring briefly to Appendix B, provided is a more detailed explanation of the algorithm. Of particular interest is routine "its_a_worst_case(). Whenever a path is pruned, either because the exisiting time of the transition is later than or equal to the DFS arrival time (in which case the path currently being traced is pruned), or because the existing time is earlier than the DFS arrival time (in which case the old path is pruned), the transition for the pruned path is copied into the stack's .old_transition slot before being overwritten. This information is used to recover paths when the algorithm finds that a speculatively-traced path must be made permanent.

Figures 3, 4:
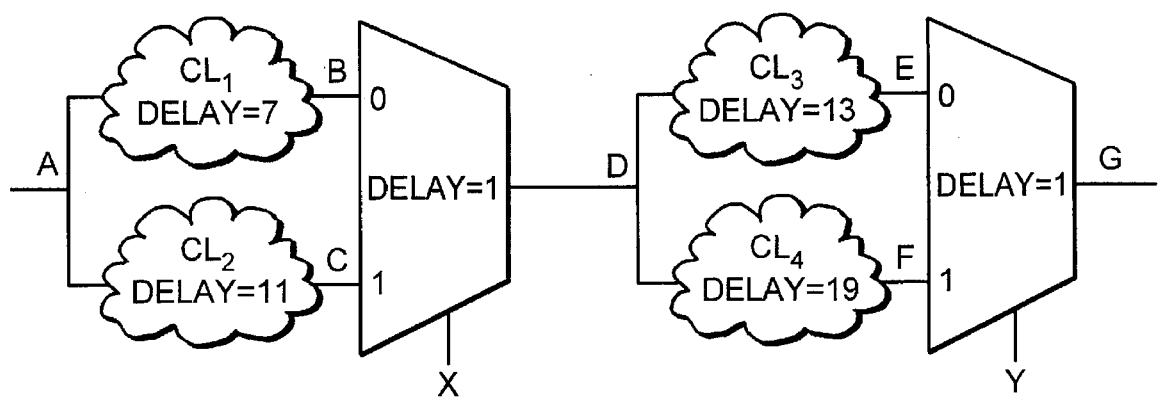
FIG. 3 is a schematic diagram of a hypothetical circuit.
FIG. 4 is a data structure diagram.
Figure 8B:
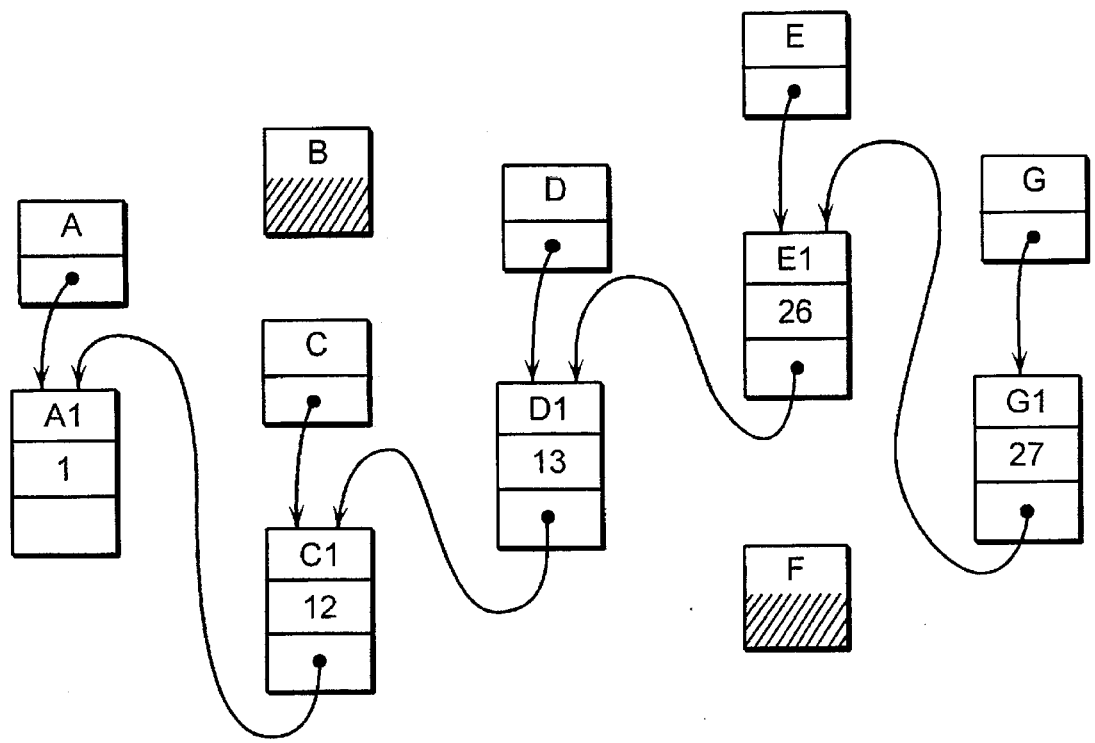
Figure 8C:
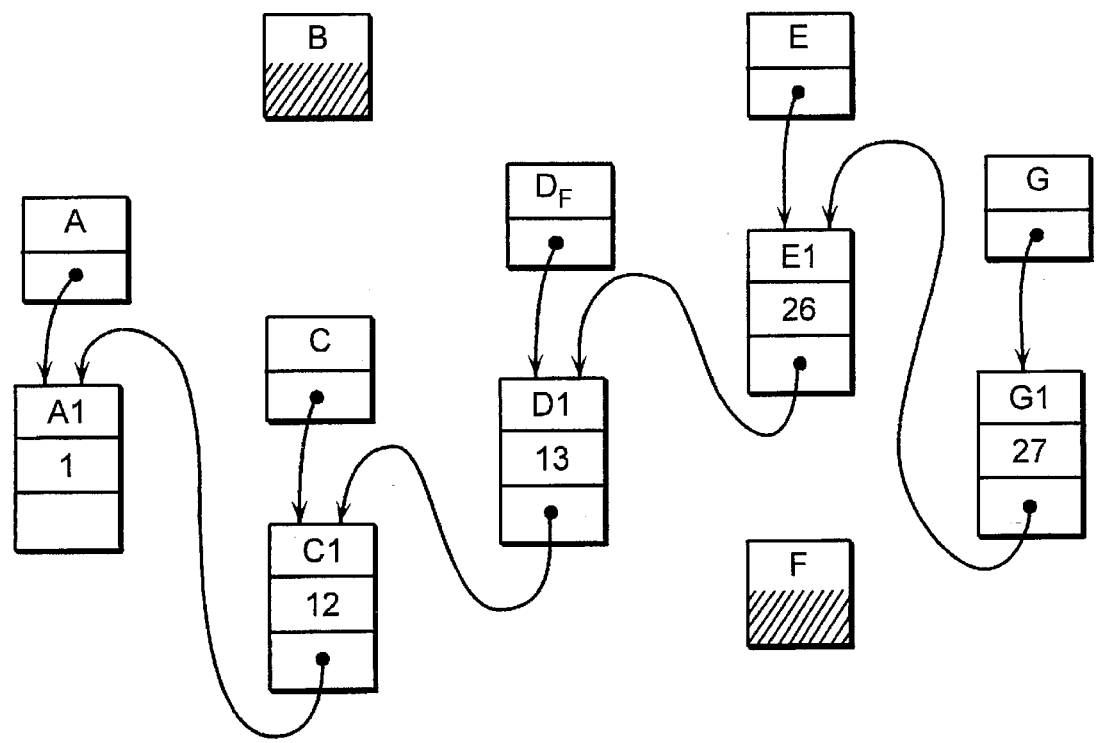
Figure 8D:
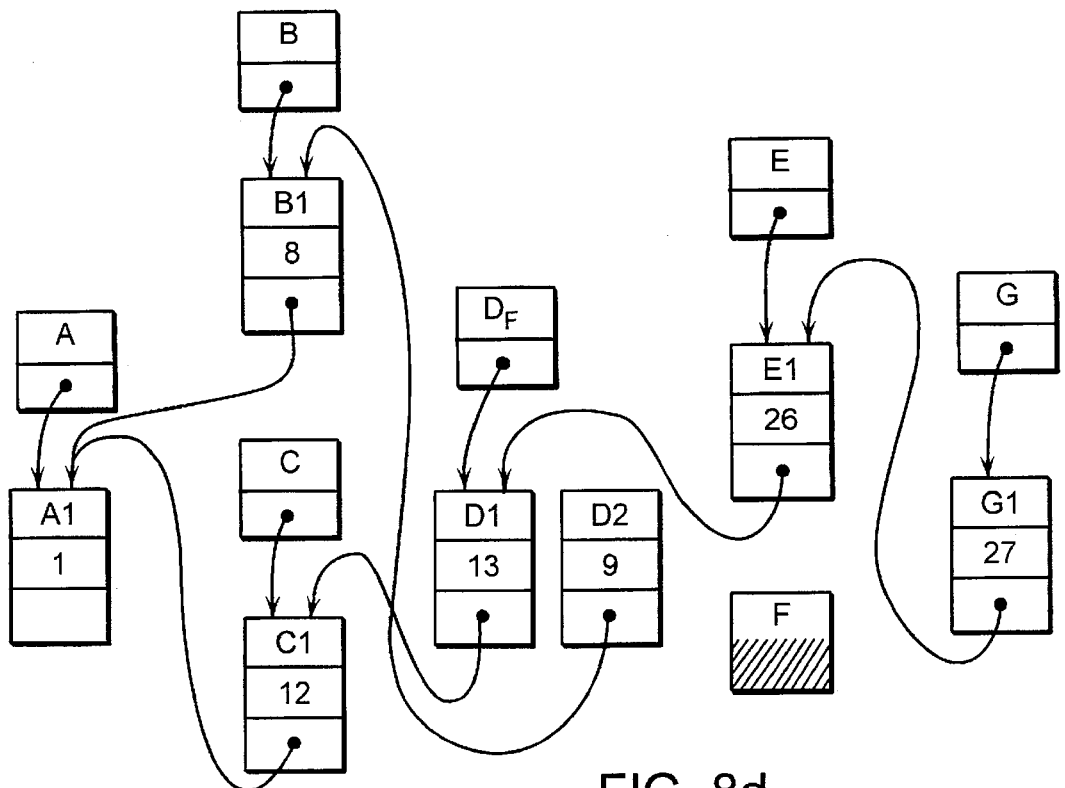
Figure 8E:
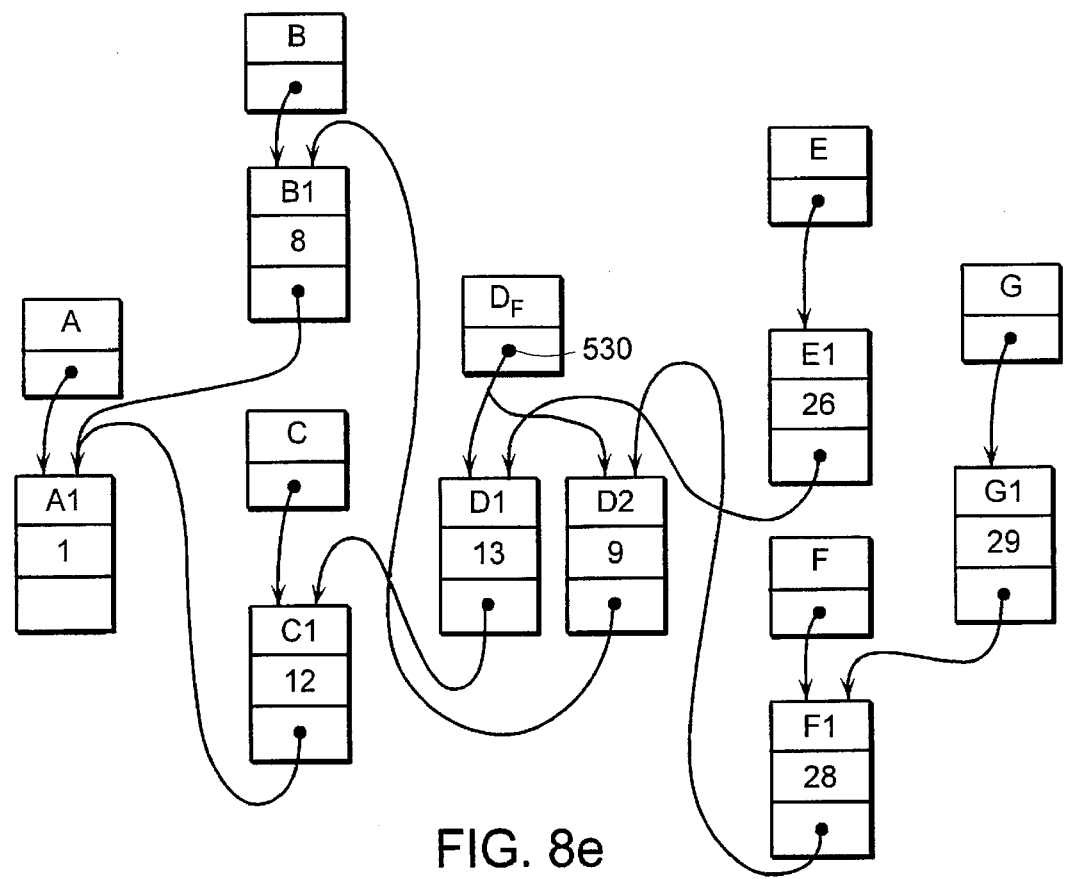

FIG. 8e shows the data structures that NTV will generate for the circuit of FIG. 3, with the "path_logically_impossible C,F" statement having been added to the model.

The data structures for nodes A, B, and C—that is, the modified node with a single transition data structure per node—are conceptually equivalent to the node data structures built in the prior art schemes.

Node D has two transition data structures: one pointing to node C showing the critical path and D's latest-transitioning driver node discovered by the unmodified search, and one transition pointing to node B (the latest-transitioning node not on the false path) showing the transition driving nodes D and F. These two transition data structures are on a linked list threaded off node D, indicated by the two-headed arrow 550. (The numeral in the name of the transition is for labelling purposes only. NTV does not number transitions this way.)

The node and transition data structures for nodes E and F are conceptually similar to the node data structures of the prior art scheme, though the connectivity is different. Note that the critical path to E is annotated by transition data structures A1-C1-D1-E1, and the critical path to node F is annotated by transition data structures A1-B1-D2-F1.

Node G indirectly has a false path associated with it (from node C), and thus the algorithm restricts the critical path analysis of G (and nodes downstream of G) to only the transition data structures labelling nodes D and F. The resulting critical path to node G will then be A-B-D-F-G, not A-C-D-F-G. This gives the proper timing estimate of 29ns worst-case for node G, not the 27ns or 30ns computed by the prior art timing verifiers.

As NTV begins execution, it reads in the external representation of the circuit model, i.e., the wire list, and constructs the node data structures. The "path_logically_impossible" directives are read and stored. The designer may want to verify only a selected region of the circuit; he specifies the input transitions for the primary input nodes to that region. The driver routine calls the modified DFS algorithm starting at each of those primary input nodes.

FIGS 8a–8e show the execution of the algorithm on the circuit of FIG. 3.

step 1: The algorithm arrives at node A. Since node A is previously unlabelled (.transitions_head is NIL). Thus, a new "transition" is created, labelling node A with time 1.

step 2: The algorithm walks to node C. Since the logic connecting A to C, CL2, consumes 11ns, on entry to the routine, the top stack element arrives pointing to node C, with .arrival_time 12. Finding C not already labelled, the algorithm creates a new transition and fills it in with time 12 and .predecessor to transition A1.

step 3: The only successor of C is D, through logic consuming 1ns, so the algorithm proceeds to D. Node D is labelled with a transition whose arrival_time is 13 and .predecessor is transition C1.

step 4: Node E is labelled with a transition whose arrival_time is 26 and .predecessor is D.

step 5: Node G is labelled with a transition whose arrival_time is 27 and .predecessor is E.

The configuration after step 5 is shown in FIG. 8b.

step 6: not shown. The stack is popped back to node E.
step 7: not shown. The stack is popped back to node D.
step 8: The algorithm arrives at node F. The check finds that F is the downstream node of a false path, and the corresponding upstream node, C, is on the stack. Accordingly, all nodes on the stack between nodes C and F, i.e., node D, are marked false_path=TRUE, as noted by the "F" in node D in FIG. 8c. The DFS probe is abandoned without labelling F.

The configuration after step 8 is shown in FIG. 10c.
step 9: not shown. The stack is popped back to node D.
step 10: not shown. The stack is popped back to node C.
step 11: not shown. The stack is popped back to node A.
step 12: Node B is labelled with a transition whose arrival_time is 8 and .predecessor is A1.
step 13: When the algorithm arrives at node D, the .arrival_time on the stack is 9, earlier than the arrival_time of transition D1, which is 13. But the algorithm notices that node D is labelled ".false_path." Thus, a tentative transition D2 with .arrival_time 9 is built in the stack's ".old_transition" slot, and ".unreal_transition" is set, noted by the "u" mark 500 in the stack entries of steps 13 and 14 of FIG. 10a. Note in FIG. 10d that there is no pointer from node D to transition D2—yet.

step 14: The algorithm arrives at node E. Since E is not marked ".false_path" and transition E1's .arrival_time, 26, is later than the DFS .arrival_time, 22, the DFS probe is pruned.

The configuration after step 14 is shown in FIG. 10d.

step 15: The stack is popped back to node D. The top stack frame indicates unreal_transition D2 with .arrival_time 9.

step 16: The algorithm walks to the remaining successor to D, i.e., node F, with .arrival_time 28. F is the downstream node of a "path_logically_impossible" directive, but the corresponding node, C, is not on the stack; thus the current path is not a false path. A non-false path to a previously unlabelled node is by definition the worst case; the algorithm therefore must build a critical path to F in this step. The path through D2 is unreal; thus the algorithm copies transition D2 out of the stack frame (using routine make_unreal_real), links the new permanent D2 onto the linked list of transitions for D, and builds a real transition F1 for node F with time 28 and predecessor D2.

step 17: The algorithm arrives at node G with .arrival_time 29 and predecessor .transition F1. The time of G's current worst case transition is G1 with .arrival_time 27. Transition G1 is updated with .arrival_time 29 and .predecessor transition F1.

The configuration after step 17 is shown in FIG. 8e. steps 18–22: not shown.

Nodes G, F, D, B, and A are popped off the stack and the algorithm is complete.

Consider an alternate scenario in which the successor lists of nodes A and D are in a different order: B will be visited before C, and E before F. The sequence of stack states is shown in FIG. 9a. The algorithm proceeds through step 18 in a manner analogous to the basic DFS scheme presented in the background, though the actions are somewhat different than presented in FIGS. 5a–5d because of the successor ordering. In step 9, the DFS .arrival_time is 29 which is later than the time previously labelling transition G1, so G1.time is updated from time 23 to 29, and G1.predecessor from E1 to F1. In step 15, transition D1 is updated: first, D1 is copied into a the stack .old_transition slot, then D1.time is updated from 9 to 13, and D1.predecessor from B1 to C1.

Figure 9B:
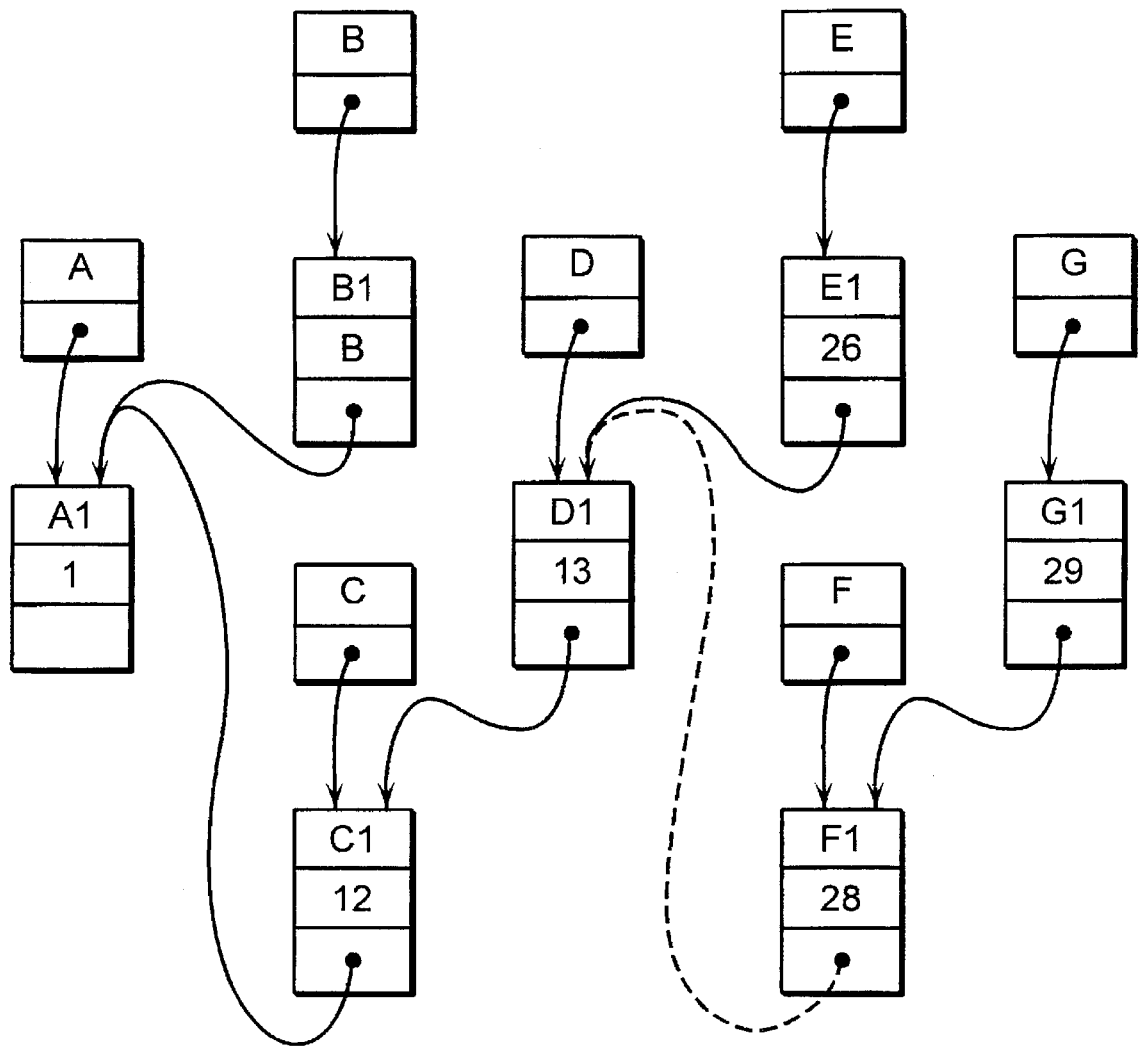

In step 16, E1.time is updated from 22 to 26. In step 17, transition G1 has time 29 (from step 9) and the DFS arrival time is 27, so the path is abandoned. In step 19, the process is back to node D, ready to visit node F, and the configuration is as shown in FIG. 9b. The edge from F1 to D1 is shown dotted, because the edge is stale: transition D1 was updated in step 15, and F has not been revisited to make corresponding updates.

In step 20, the algorithm walks into node F and finds that the path from C is a false path. Once the false path is identified, the algorithm checks to see if there are any stale edges, by comparing the times on the transition path back from the node to the arrival times in the .old_transitions in the stack, and if the current transition, e.g., F1, points to the previous node on the stack, e.g., node D. If the algorithm cannot prove that the edge is not stale, it makes the worst-case assumption, i.e., that the edge is stale. Had this path not been a false path, then the stale edge would have been removed when the new F1.time was written. Note from FIG. 8e that the algorithm should create a transition D2 with .time 9 and .predecessor B1; however NTV currently does not have the information available to reconstruct the A-B-D-F path. When the stale edge is found, the ".impossible_path_messup" bit in the transition data structure is set TRUE to force generation of a warning diagnostic when the transition is reported in the output.

Two methods have been considered for reconstructing the path A-B-D-F, but both have been rejected as expensive to implement, one in memory, the other in time. One method would be to save all of the old transitions for each node; the other method would be to make a second pass over the circuit to regenerate the lost transitions.

Information which may be useful in connection with the invention, including data structure information, is set forth in copending U.S. patent application No. 5,355,321, issued Oct. 11, 1994, filed on the same day as this application, titled "Static Timing Verification", assigned to the same assignee as this invention, and incorporated by reference".

Other embodiments are within the scope of the following claims.

The method is readily adaptable to timing verifiers that use other basic algorithms. For instance, the depth-first search could be replaced by a a topological sort on the nodes of the circuit; the walk would be done in a natural order, queueing each node onto a ready list when all its driving nodes have been visited. In this case, the part one time propagation and part two comparison would be modified analogously.

The method can be used with timing verifiers that compute timing information for multiple phases and senses, and with timing verifiers that work on transistor-, gate- or functional block-level designs.

The method can be used in other problem domains with algorithms that trace graphs with logic exclusivity, for instance PERT charts and related scheduling problems, and traffic flow analyses.

APPENDIX A

FOR

UNITED STATES LETTERS PATENT

TITLE: STATIC TIMING VERIFICATION IN THE PRESENCE OF LOGICALLY FALSE PATHS

APPLICANT: LARRY L. BIRO, JOEL J. GRODSTEIN, JENG-WEI PAN, NICHOLAS L. RETHMAN

"Express Mail" mailing label number RB99291972X

Date of Deposit  June 12, 1992

I hereby certify under 37 CFR 1.10 that this correspondence is being deposited with the United States Postal Service as "Express Mail Post Office to Addressee" with sufficient postage on the date indicated above and is addressed to the Commissioner of Patents and Trademarks, Washington, D.C. 20231.

Jody O'Meara

```
/******************************************************************/
/* Copyright (c) 1992 by Digital Equipment Corporation, Maynard, Mass */
/******************************************************************/
#include <stdio>
#include <descrip>
#include "segcad$base_c_macros"
typedef char sense_type;
typedef char boolean;

/* ------------------ ntv constants ------------------------------*/
#define K$MAX_DEPTH            2000
#define k$UNVISITED_NODE       -999    /* original node arrival time */
#define K$NAME_LENGTH          512     /* # of chars in a name. */
#define TRUE                   1
#define FALSE                  0
#define K$CH_OUT               3
#define K$SRC                  3
#define K$GAT                  2
#define K$CH_IN                1
#define K$DRN                  1
#define SOURCE(dev)   ((dev)->node[0])
#define GATE(dev)     ((dev)->node[1])
#define DRAIN(dev)    ((dev)->node[2])
#define CH_IN(dev)    ((dev)->node[0])
#define CH_OUT(dev)   ((dev)->node[2])
#define K$RISE                 2
#define K$FALL                 1
#define K$MAX_PLI_HASH_TABLE   503
#define HASH_INDEX(node) ((((int)node)/2)%K$MAX_PLI_HASH_TABLE)
#define K$GATE_LENGTH          2.0
define K$SENSE                2 ifdef NTV_FOUR_PHASE
typedef unsigned short int phase_timing_type;
#define K$NUM_PHASES_MAX 4
#define K$NUM_PHASES     4
endif static char ttt[K$NAME_LENGTH];
define DIE(args) { printf args ; exit (1); }
#define DATA_ERROR(message) { PRINT (message); error_has_occurred = TRUE; }
#define DATA_ERROR_AND_RETURN(message) { PRINT (message); \
                                    error_has_occurred = TRUE; return; }
#define PRINT(args) { sprintf args; putt (ttt); }
define PRINT_NO_SKIP(args) { sprintf args; putt_no_skip (ttt); } static $segcad_make_vs_descrip(ttt_des, K$NAME_LENGTH,"");

define NEXT(item) item = item->next

/* One of the first two transitions. It doesn't need a node or next field, */
/* since it's not part of a hash table. */
struct small_transition_rec
{
    struct transition_rec *predecessor;  /* input transition which caused  */
                                         /* this one.                       */
    int     arrival_time;                /* the time stamp.                */
    unsigned rising : 1;                 /* rising transition or falling one? */
    unsigned unconditional : 1;          /* is this transition unconditional? */
    unsigned phase   : 4;                /* what phase is the transition in? */
                                         /* The "4" is big enough, and fits in*/
                                         /* a byte.                         */
    unsigned impossible_path_messup:1;   /*                                 */
    struct node_rec *node;               /* Node which the transition is on. */
};
```

```c
/* These are the two data structures for transitions. They are private   */
/* objects that can be touched only by ntv$transitions.c and              */
/* ntv$dfs_traversing.pli. The idea is that most nodes have two transitions:*/
/* one rising and one falling.  Thus we allocate memory in a node record for */
/* these two, which can be accessed very fast since they're part of the node */
/* record.  The rare node with more than two transitions will have the extras*/
/* stored in NTV's transitions hash table, which is slower.              */
/*                                                                        */
/* An "extra" transition, part of a hash table of extra transitions.      */
struct transition_rec
{
    struct transition_rec *predecessor; /* input transition which caused  */
                                        /* this one.                      */
    int       arrival_time;             /* the time stamp.                */
    unsigned rising : 1;                /* rising transition or falling one? */
    unsigned unconditional : 1;         /* is this transition unconditional? */
    unsigned phase   : 4;               /* what phase is the transition in? */
                                        /* The "4" is big enough, and fits in*/
                                        /* a byte.                        */
    unsigned impossible_path_messup:1;  /*                                */
    struct node_rec *node;              /* Node which the transition is on. */
    struct transition_rec *next;        /* Next in hash table.            */
};

/* node record data format */
struct node_rec
{
    struct small_transition_rec transitions[2];
    unsigned has_more_transitions : 1;

/* node quality information */
    unsigned char status;               /* vdd,vss and visited status     */
    unsigned vdd_node : 1;              /* is this node vdd?              */
    unsigned vss_node : 1;              /* is this node vss?              */

/* other flags */
    unsigned state : 1;                 /* general purpose flag           */ unsigned has_impossible_path : 1;   /* there is a user-specced impossible*/
                                        /* path ending at this node.      */
    unsigned false_path_traced : 1;     /* there has been a false path on any*/
                                        /* path involving this node.      */
                                        /* the mark_block_points routine. */

/* connection information */
    struct path_rec *paths;             /* list of DC paths out of node   */
    struct device *devices;             /* list of device connections     */ struct node_rec *hash_next;         /* ptr to remainder of hash entry 1st*/
    struct node_rec *next_node;         /* ptr to next node in sorted list */
    struct name_rec *node_name;
};

/* device data record */
struct device_rec
{
    unsigned status : 1;
    unsigned p_device: 1;
    struct node_rec *node[3];           /* source, gate, drain            */
    float width;
    struct device_rec *next;
    struct name_rec *name;
    unsigned pass_one : 1;              /* true if device passes a one level */
```

```
        unsigned pass_zero : 1;              /* true if device passes a zero level*/
};

/* general device connection information */
struct device
{
    struct device_rec *device_ptr;    /* points to "device_rec"          */
    char node;                         /* which node of the device        */
    struct device *next;
};

/* List of nodes. */
struct node_list_rec
{
    struct node_rec *node;
    struct node_list_rec *next;
};

/* List of devices. */
struct device_list_rec
{
  struct device_rec *dev;
  struct device_list_rec *next;
};

/* path record structure */
struct path_rec
{
    struct node_rec *node;
    struct device_rec *device_ptr;
    struct path_rec *next;
};

struct list_rec
{
    struct node_rec *node;
    unsigned delete_bit : 1;
    int transition [K$NUM_PHASES_MAX][K$SENSE];
    struct list_rec *next;
};

struct name_rec
{
    char name_len;              /* length of name                                    */
    char name[K$NAME_LENGTH];   /*The size of name is not K$NAME_LENGTH.  The */
                                /*real size is declared in pli code.  We make */
                                /*this an array to trick the c code.  Never   */
                                /*allocate this structure in the c code.      */
};

struct g$v_stack_item
{
    struct node_rec *node;       /* data node pointer                */
    sense_type data_sense;       /* node data sense                  */
    struct device_rec *mos;
    char pass_thru_phase;        /* current pass thru phase          */
    int arrival_time;
    struct node_rec *forced_by_me;
    struct transition_rec *transition;
    struct transition_rec old_transition;
```

```
        unsigned unreal_transition : 1;
        unsigned rising : 1;
};
```

```
/******************************************************************/
/* Copyright (c) 1992   by Digital Equipment Corporation, Maynard, Mass  */
/******************************************************************/
/*
******************************************************************
* AUTHORS:                                                        *
*         JOEL     GRODSTEIN                                      *
*         JENGWEI  PAN                                            *
*         NICK     RETHMAN                                        *
******************************************************************
*/
#include "ntv$based.h"
#include "functions$h"

#define CURRENT_FRAME_INDEX (g$v_depth-1) /* handle the PLI->C array indexing*/
#define PREV_FRAME_INDEX    (g$v_depth-2)
#define CURRENT_FRAME       (&g$v_stack[g$v_depth-1])
#define PREV_FRAME          (&g$v_stack[g$v_depth-2])
#define HASH_INDEX(node)    ((((int)node)/2)%K$MAX_PLI_HASH_TABLE)
#define HAS_INVERSION g$v_stack [frame].rising != g$v_stack [frame+1].rising
define NTV$V_PHASE_LENGTH 4 static char buf[K$NAME_LENGTH];
static void big_delay_error(struct device_rec *device,
                            struct node_rec *in_node,
                            struct node_rec *out_node,
                            int device_delay);
static void propagate_this_transition(struct list_rec *trans_ptr);
static void DFS_propagate(struct node_rec *in_node, boolean rising);
static int update_pass_through(int phi_old, int t_old, int phi_new);
static boolean push_and_set_is_ok(struct node_rec *node,
                                  boolean rising,
                                  struct device_rec *device);
static boolean its_a_worst_case(struct node_rec *out_node, boolean rising);
static struct transition_rec *g$v_transitions_hash_table [K$MAX_PLI_HASH_TABLE];
static void set_time_stamp (struct node_rec *node, int phase, boolean rising,
                            int time);
static void recover_old_stack_transitions (int bad_frame, struct transition_rec
                                           *bad_tran);
static void make_unreal_stack_real (int real_sp);
static boolean false_path (struct node_rec *node);
static boolean impossible_path(struct node_rec *node, boolean rising, int phase,
                               int *first_node_index);
globaldef int g$v_depth=0;
globaldef struct g$v_stack_item g$v_stack[K$MAX_DEPTH];
globalref int g$v_max_stack_depth;
globalref int ntv$v_unvisited_node;
```

```c
/************************    *************************   *************************/
/* Copyright (c) 1992 by Digital Equipment Corporation, Maynard, Mass   */
/*********************************************************************************/
/* The main entry into the traversing routine.                                   */
/*********************************************************************************/
void ntv$dfs_traversing()
{
  globalref struct list_rec *ntv$v_primary_input_list, *ntv$v_set_arrival_list;
  $segcad_make_vs_descrip(timer_desc, K$NAME_LENGTH, "DFS_traversing");
  struct list_rec *lptr;

clear_node_state_bits();

/* Propagate each primary input. */
  for(lptr=ntv$v_primary_input_list; lptr!=NULL; NEXT (lptr))
    if(!lptr->delete_bit)
      propagate_this_transition(lptr);

/* Propagate all nodes with a user-specified set/arrival timing. */
  for(lptr=ntv$v_set_arrival_list; lptr!=NULL; NEXT (lptr))
    propagate_this_transition(lptr);
}
```

```
/***********************  *************************  *************************/
/* Copyright (c) 1992 by Digital Equipment Corporation, Maynard, Mass     */
/*******************************************************************************/
static void propagate_this_transition(struct list_rec *trans_ptr)
{
  boolean rising, worst_case;
  int phi, time, old_time, uncond_transition;
  struct node_rec *node;

node = trans_ptr->node;
  if(!constant_voltage(node))    /* Don't propagate nodes that don't transition*/
    for(phi=1; phi<=K$NUM_PHASES; ++phi)
    {
      for(rising=FALSE; rising<=TRUE; ++rising)
      {  /* "phi-1" is to translate to C */
        time = trans_ptr->transition[phi-1][rising];

if(time!=ntv$v_unvisited_node)
        {
          copy_transition_rec(&(g$v_stack[0].old_transition),
                              find_transition(node, phi, rising));
          g$v_stack[0].unreal_transition = TRUE;
          set_time_stamp(node, phi, rising, time);
          g$v_stack[0].pass_thru_phase = phi;
          g$v_stack[0].arrival_time = time;

/* g$v_depth will always equal zero at this point because we start */
          /* at zero and never push without poping. */
          if(push_and_set_is_ok(node, rising, NULL) &&
             its_a_worst_case(node, rising))
            dfs_propagate(node, rising);
          pop_and_reset_bit();
        }
      }
    }
}
```

```
/************************   *************************   ************************/
/*  Copyright (c) 1992 by Digital Equipment Corporation, Maynard, Mass    */
/***********************************************************************/
static boolean push_and_set_is_ok(struct node_rec *node,
                                  boolean rising,
                                  struct device_rec *device)
{
    globalref boolean ntv$v_interactive_flag, ntv$v_race_through_latch_check;
    globalref int ntv$v_which_delay_model;
    struct transition_rec *trans, *pred_trans;
    int in_phase, new_phase, new_time, *pred_phase, *pred_sense;
    boolean blocked, race, false_p;
    struct node_rec *in_node, **pred_node;

++g$v_depth;

CURRENT_FRAME->node = node;
    CURRENT_FRAME->rising = rising;
    CURRENT_FRAME->mos = device;

if(g$v_depth == 1)
        return(!false_path (node));

/* Determine whether a synchronizer changes the phase of the path and/or   */
    /* stops it dead.                                                          */
    new_phase = in_phase = PREV_FRAME->pass_thru_phase;
    in_node = PREV_FRAME->node;

/*********************** Code unrelated to patent removed *****************/
    /* if(blocked because of synchronizers)                                   */
    /*    return(FALSE);                                                      */
    /***********************************************************************/

CURRENT_FRAME->pass_thru_phase = new_phase;

if(g$v_depth == g$v_max_stack_depth)
    {
        /****************** Code unrelated to patent removed *****************/
        /*             Print out and error message.                          */
        /***********************************************************************/
        exit();
    } false_p = false_path(node);

/* return TRUR if there is NO false path   */
    if(!false_p)
        return(TRUE);

/* the following code is to deal with when there is a false path:       */
    trans = find_transition(node, new_phase, rising);

/* There's no transition to have a bad pointer or no pointers written on  */
    /* this path, then no problem, so don't do anything.                      */
    if(trans == NULL || g$v_depth == 1)
        return (FALSE);

/* If there's no old transition at [PREV], the transition at [CURRENT] was */
    /* definitely caused by this transition at [PREV]. (This can happen, e.g., */
    /* if there's two n devices in parallel). So the pointers aren't messed up.*/
    if(transition_time(&(PREV_FRAME->old_transition)) == ntv$v_unvisited_node)
        return(FALSE);
```

```
/*********************  :***********************   ************************/
/*   Copyright (c)   1992   by  Digital   Equipment Corporation, Maynard, Mass    */
/************************************************************************/
   /* A messup situation exists when the existing transition at 'node' has a  */
   /* pointer to the previous frame. If the path up until now is unreal (i.e.,*/
   /* it has no worst-case transitions on it and is just being traced because */
   /* we thought it might later), then we can just return false and let it    */
   /* gracefully die. */
   pred_trans = backup_path(trans, &pred_node, &pred_phase, &pred_sense);
   if(pred_trans == PREV_FRAME->transition && !PREV_FRAME->unreal_transition)
   { /* uh-oh! */
      /* If it's possible to think that this output transition really was    */
      /* caused by this input transition (in a previous traversal) then don't */
      /* recover the stack -- just set the messup bit.  This is because when  */
      /* this happens, there may not be any old transitions around to recover */
      /* from (causing a stack dump); and even if there are, they are         */
      /* meaningless.                                                         */
      if((PREV_FRAME->arrival_time < transition_time(trans)) ||
         ((PREV_FRAME->arrival_time == transition_time(trans)) &&
          (PREV_FRAME->node == CH_IN(device))))
        trans->impossible_path_messup = TRUE;
      else
        recover_old_stack_transitions(g$v_depth-1, trans);
   }
   return(FALSE);
}
```

```c
/***********************  ************************; *************************/
/*  Copyright (c)  1992  by  Digital  Equipment  Corporation, Maynard, Mass  */
/****************************************************************************/
boolean false_path (node)
struct node_rec *node;
{
    boolean n_dev, rising, other_rising;
    int pass_thru_phase, previous_phase, first_index;
    struct device_rec *device;
    struct node_rec *other_node;

g$v_stack [CURRENT_FRAME_INDEX].node = NULL;

/* break the circuit loop */
    if (node->state || (node->status != 0))
        return (TRUE);

/* mark as visited */
    node->state = TRUE;
    g$v_stack[CURRENT_FRAME_INDEX].node = node;

rising = g$v_stack[CURRENT_FRAME_INDEX].rising;
    pass_thru_phase = g$v_stack[CURRENT_FRAME_INDEX].pass_thru_phase;
    device = g$v_stack[CURRENT_FRAME_INDEX].mos;

/* If this node is the last node in a specified false path then check   */
    /* the stack to see if the current path (The one on the stack) is a     */
    /* false path.                                                          */
    if (node->has_impossible_path &&
                impossible_path (node, rising, pass_thru_phase,&first_index))
        return (TRUE);

/* ********** the reset of code unrelated to patent removed *************/
    /* The rest of the checks depend on this input conflicting with something*/
    /* already on the stack. Remove it.                                      */
}
```

```
/************************  :**********************:  ***********************/
/* Copyright (c)   1992   by   Digital  Equipment Corporation, Maynard, Mass  */
/****************************************************************************/
static int update_pass_through(int phi_old, int t_old, int phi_new)
{
    /* when a signal crosses the different clock phase boundary, it shall    */
    /* adjust its phase accordingly.                                         */
    return(t_old -
        (((phi_new - phi_old + K$NUM_PHASES) % K$NUM_PHASES) *   /* phase diff */
        NTV$V_PHASE_LENGTH));
}
```

```
/***********************  ***********************  ***********************/
/* Copyright (c) 1992 by Digital Equipment Corporation, Maynard, Mass    */
/*************************************************************************/
static boolean its_a_worst_case(struct node_rec *out_node, boolean rising)
{
  int device_delay, out_arrival_time, old_out_arrival_time;
  int out_phase;
  struct transition_rec *out_transition;
  boolean worst_case, uncond_tran;

/* Get outputs from the stack. */
  out_phase = CURRENT_FRAME->pass_thru_phase;
  out_transition = find_or_make_transition(out_node, out_phase, rising);
  CURRENT_FRAME->transition = out_transition;

/* If this is a primary input, it's definitely the worst case. But make */
  /* sure not to return until 'transition' is set correctly on the stack. */
  if(CURRENT_FRAME_INDEX == 0)
    return(TRUE);

old_out_arrival_time = out_transition->arrival_time;
  /*************** Code unrelated to patent removed ********************/
  /* device_delay = The delay through the device.                       */
  /**********************************************************************/
  out_arrival_time = PREV_FRAME->arrival_time + device_delay;
  out_arrival_time = update_pass_through(PREV_FRAME->pass_thru_phase,
                                         out_arrival_time, out_phase);
  if(out_arrival_time > old_out_arrival_time)
  {
    copy_transition_rec(&(CURRENT_FRAME->old_transition), out_transition);
    out_transition->arrival_time = out_arrival_time;
    out_transition->predecessor = PREV_FRAME->transition;
    CURRENT_FRAME->arrival_time = out_arrival_time;
    CURRENT_FRAME->unreal_transition = FALSE;

if(PREV_FRAME->unreal_transition)
      make_unreal_stack_real(CURRENT_FRAME_INDEX);
    return(TRUE);
  }
  /* If there's been a false path encompassing this node, then we propagate */
  /* even if we're not the worst case (because maybe this path can get to   */
  /* someplace downstream that the old path, because of the PLI, did not).  */
  /* In this case, we don't want to waste memory making transitions for every*/
  /* node just on the off chance that we might get someplace real. So, we   */
  /* don't make any transitions, but just set the unreal_transition stack   */
  /* bit.  If, at some point, we do become a worst-case, then we take all of*/
  /* the (node,pass_thru_phase,rising) info on the stack and make real      */
  /* transitions out of them.                                               */
  else if(out_node->false_path_traced)
  {
    copy_transition_rec(&(CURRENT_FRAME->old_transition), out_transition);
    CURRENT_FRAME->arrival_time = out_arrival_time;
    CURRENT_FRAME->unreal_transition = TRUE;
    return(TRUE);
  }
  return(FALSE);
}
```

```c
/*********************  **********************:  *************************/
/* Copyright (c) 1992 by Digital Equipment Corporation, Maynard, Mass  */
/**************************************************************************/
static void DFS_propagate(struct node_rec *in_node, boolean rising)
{
  struct device *dp;
  struct device_rec *device;
  struct node_rec *out_node;

for(dp=in_node->devices; dp!=NULL; NEXT (dp))
  {
    device = dp->device_ptr;

/* Weed out some trivial cases which do nothing. */
    if(out_node->vdd_node || out_node->vss_node ||
       (out_node == in_node) ||
       constant_voltage(out_node))
      continue;

if(GATE(device) == in_node)
    {
      /* skip inactive transition */
      if(device->p_device == rising)
        continue;

if(device->pass_one)
      {
        if(push_and_set_is_ok(out_node, TRUE, device) &&
           its_a_worst_case(out_node, TRUE))
          DFS_propagate(out_node, TRUE);
        pop_and_reset_bit();
      } if(device->pass_zero)
      {
        if(push_and_set_is_ok(out_node, FALSE, device) &&
           its_a_worst_case(out_node, FALSE))
          DFS_propagate(out_node, FALSE);
        pop_and_reset_bit();
      }
    }
    else if(CH_IN(device) == in_node)
    {
      if(always_off(device))
        continue;

if(rising ? !device->pass_one : !device->pass_zero)
        continue;

if(push_and_set_is_ok(out_node, rising, device) &&
         its_a_worst_case(out_node, rising))
        DFS_propagate(out_node, rising);
      pop_and_reset_bit();
    }
  }
}
```

```
/*********************   :********************:   ***********************/
/* Copyright (c) 1992 by Digital Equipment Corporation, Maynard, Mass   */
/************************************************************************/
void pop_and_reset_bit()
{
  struct node_rec *node;

/* Clear visited flag.  If we didn't set the state bit, node is still   */
  /* NULL (see false_path for how this happens).  Node may be NULL if it is */
  /* a false path. */
  if((node = CURRENT_FRAME->node) != NULL)
  {
    node->state = FALSE;
    node->status = 0;
  } if((node = CURRENT_FRAME->forced_by_me) != NULL)
    node->status = 0;

/* Pop out one step, reset all pointers */
  CURRENT_FRAME->forced_by_me = NULL;
  CURRENT_FRAME->node = NULL;
  CURRENT_FRAME->mos = NULL;
  --g$v_depth;
}
```

```
/********************   :*********************:   ***********************/
/*  Copyright (c)  1992  by  Digital  Equipment Corporation, Maynard, Mass   */
/*************************************************************************/
/* Set a node's time stamp for a given phase,sense to a value (in NTV */
/* internal time units). */
void set_time_stamp (node, phase, rising, time)
struct node_rec *node;
int phase, time;
boolean rising;
{
    struct transition_rec *transition, *new;

transition = find_or_make_transition (node, phase, rising);
    transition->arrival_time = time;
}
```

```
/************************   :************************    ************************/
/*  Copyright (c) 1992 by Digital  Equipment Corporation, Maynard, Mass   */
/******************************************************************************/
/* With false paths, often the non-worst-case timing on node A can cause the */
/* worst-case timing on node B.  Thus, we need to keep around more than one  */
/* transition for a given phase/sense on node A.                             */
/* When you're traversing the nodes which may have multiple transitions, you */
/* don't want to just create lots of transitions, or else you run out of     */
/* virtual memory!  So we just record the arrival times into the stack, and  */
/* recover the transitions later, only if we have to. */
void make_unreal_stack_real (real_sp)
int real_sp;
{
    int i;
    globalref struct g$v_stack_item g$v_stack[K$MAX_DEPTH];
    struct transition_rec *new;

for (i=real_sp-1; g$v_stack [i].unreal_transition; --i)
    {
        if (i<0)
           DIE (("%F -- internal error -- No real transitions on the stack!"));
        new = create_transition (g$v_stack [i].node,
                                 g$v_stack [i].pass_thru_phase,
                                 g$v_stack [i].rising);
        new->arrival_time = g$v_stack [i].arrival_time;
        new->predecessor = (i == 0) ? NULL : g$v_stack[i-1].transition;
        new->unconditional = node_uncond_transitions(g$v_stack[i].node,
                            g$v_stack[i].pass_thru_phase);
        g$v_stack [i].transition = new;
        g$v_stack [i+1].transition->predecessor = new;
        g$v_stack [i].unreal_transition = FALSE;
    }
}
```

```
/*************************  :***********************:   ***********************/
/*  Copyright (c)  1992  by  Digital  Equipment  Corporation, Maynard, Mass  */
/*****************************************************************************/
void recover_old_stack_transitions (bad_frame, bad_tran)
int bad_frame;
struct transition_rec *bad_tran;
{
    struct transition_rec *new;
    globalref struct g$v_stack_item g$v_stack[K$MAX_DEPTH];
    int i;

/* Traverse the stack backwards, and follow it until the paths diverge. */
    /* The common portion of (this path) and (the path back from the old    */
    /* transition) is the stuff we've overwritten, and needs to be recreated.*/
    for (i=bad_frame-1; g$v_stack[i].node == bad_tran->predecessor->node; --i)
    {
        if (i<0)
            DIE (("%F -- internal error -- PLI paths never diverge!"));

/* If bad_tran points to another transition, then it actually points */
        /* this node, being traversed in an old phase/sense, which should    */
        /* still be intact. */
        if (bad_tran->predecessor != g$v_stack[i].transition)
            return;

/* If bad_tran could have come from the current stack transition,  */
        /* then we better not re-point it to the old transition (since that */
        /* one is probably invalid by now).                                 */
        if (g$v_stack[i].arrival_time <= bad_tran->arrival_time)
        {
            bad_tran->impossible_path_messup = TRUE;
            return;
        } new = create_transition (bad_tran->predecessor->node,
                                 g$v_stack[i].old_transition.phase,
                                 g$v_stack[i].old_transition.rising);

/* Remember, don't touch the hash-next field. */
        new->arrival_time = g$v_stack[i].old_transition.arrival_time;
        new->predecessor = g$v_stack[i].old_transition.predecessor;
        bad_tran->predecessor = new;
        bad_tran = new;

/* We've backed up to a primary input, so we're done.  */
        if (bad_tran->predecessor == NULL)
            return;
    }
}
```

```
/*********************   :********************:   ************************/
/*  Copyright (c) 1992  by  Digital  Equipment Corporation, Maynard, Mass  */
/*************************************************************************/
/* It also sets prev_node_pp, prev_phase_p, and prev_sense_p to the node,  */
/* phase, and sense of the predecessor transition.                         */
struct transition_rec
*backup_path (transition, prev_node_pp, prev_phase_p, prev_sense_p)
struct transition_rec *transition;
struct node_rec **prev_node_pp;
int *prev_phase_p, *prev_sense_p;
{
    struct transition_rec *prev_tran;

if (transition == NULL)
    {
        *prev_node_pp = NULL;
        return (NULL);
    } prev_tran = transition->predecessor;
    if (prev_tran == NULL)
        *prev_node_pp = NULL;
    else
    {
        *prev_node_pp = prev_tran->node;
        *prev_phase_p = prev_tran->phase;
        *prev_sense_p = prev_tran->rising? K$RISE : K$FALL;
    } return (prev_tran);
}
```

```
/*************************  *************************   ************************/
/*   Copyright (c)  1992  by  Digital  Equipment Corporation,  Maynard,  Mass    */
/*******************************************************************************/
/* Given a node, phase, and sense, finds the equivalent transition.            */
/* If there is none, it returns NULL.                                          */
/* One more trick:  because of false paths, there may well be more than one    */
/* transition for a given node.  If so, it returns the latest one. */
struct transition_rec *
find_transition (node, phase, rising)
struct node_rec *node;
int phase;
boolean rising;
{
    int bucket_numb;
    struct transition_rec *transition, *good_one=NULL;

if ((node->transitions [rising].phase == phase))
        good_one = &node->transitions [rising];

if (!node->has_more_transitions)
        return (good_one);

bucket_numb = HASH_INDEX (node);
    for (transition = g$v_transitions_hash_table [bucket_numb];
         transition != NULL; NEXT (transition))
    {
        if ((transition->phase == phase) && (transition->rising == rising))
            if (   (good_one == NULL)
                || (transition->arrival_time > good_one->arrival_time))
                good_one = transition;
    }
    return (good_one);
}
```

```
/*********************  :************************  ************************/
/* Copyright (c) 1992 by Digital Equipment Corporation, Maynard, Mass    */
/*************************************************************************/
/* Given a node, phase, and sense, finds the equivalent transition.       */
/* If there is none, it makes a new one for that node/phase/sense, sets   */
/* the time-stamp to ntv$v_unvisited_node, and returns it.                */
struct transition_rec *
find_or_make_transition (node, phase, rising)
struct node_rec *node;
int phase;
boolean rising;
{
    struct transition_rec *transition;

if ((node->transitions [rising].phase == phase))
        return (&node->transitions [rising]);

if (node->transitions [rising].arrival_time == ntv$v_unvisited_node)
    {
        node->transitions [rising].phase = phase;
        node->transitions [rising].rising = rising;
        node->transitions [rising].node = node;
        return (&node->transitions [rising]);
    } if (!node->has_more_transitions)
    {
        node->has_more_transitions = TRUE;
        return (create_transition (node, phase, rising));
    } for (transition = g$v_transitions_hash_table [HASH_INDEX (node)];
         transition != NULL; NEXT (transition))
    {
        if ((transition->node==node)
            && (transition->phase == phase) && (transition->rising == rising))
            return (transition);
    }
    return (create_transition (node, phase, rising));
}
```

```
/*********************   :**********************:   ************************/
/*   Copyright (c)  1992  by  Digital   Equipment Corporation, Maynard, Mass   */
/****************************************************************************/
struct transition_rec *create_transition (node, phase, rising)
struct node_rec *node;
int phase;
boolean rising;
{
    struct transition_rec *transition;

transition =(struct transition_rec *)malloc(sizeof(struct transition_rec));
    transition->arrival_time = ntv$v_unvisited_node;
    transition->predecessor = NULL;
    transition->rising = rising;
    transition->impossible_path_messup = FALSE;
    transition->unconditional = FALSE;
    transition->phase = phase;
    transition->node = node;
    transition->next = g$v_transitions_hash_table [HASH_INDEX (node)];
    g$v_transitions_hash_table [HASH_INDEX (node)] = transition;
    return (transition);
}
```

```
/********************  :***********************  ***********************/
/*  Copyright (c) 1992 by Digital Equipment Corporation, Maynard, Mass   */
/***********************************************************************/
void copy_transition_rec(struct transition_rec *dest,
                         struct transition_rec *src)
{
  dest->predecessor            = src->predecessor;
  dest->arrival_time           = src->arrival_time;
  dest->rising                 = src->rising;
  dest->unconditional          = src->unconditional;
  dest->phase                  = src->phase;
  dest->impossible_path_messup = src->impossible_path_messup;
  dest->node                   = src->node;
  dest->next                   = src->next;
} boolean impossible_path(struct node_rec *node,
                        boolean rising,
                        int phase,
                        int *first_node_index)
{ struct pli_node_item_rec
{
    struct node_rec *node;
    int phase;     /* or K$NOT_FOUND. */
    boolean rising;
    boolean uses_rising;
    struct pli_node_item_rec *next;
};

struct pli_hash_rec
{
    short int min_inversions;
    unsigned device_is_list : 1;        /* True if device union is a list. */
    union
    {
        struct device_rec *dev;
        struct device_list_rec *list;
    } device;
    struct pli_node_item_rec *node_list;
    struct pli_hash_rec *next;
};

static struct pli_hash_rec *pli_hash_table[K$MAX_PLI_HASH_TABLE];

struct pli_hash_rec *pli;
    struct pli_node_item_rec *node_item;
    int frame, n_inversions, i;
    globalref int ntv$v_pli_span_limit;
```

```
/************************ :***********************: ***********************/
/*  Copyright (c) 1992 by Digital Equipment Corporation, Maynard, Mass   */
/***********************************************************************/
    *first_node_index = -1;
    for(pli=pli_hash_table [HASH_INDEX (node)]; pli!=NULL; NEXT (pli))
    {
        if (matches (pli->node_list, CURRENT_FRAME_INDEX))
        {
            for (node_item = pli->node_list; node_item!=NULL; NEXT (node_item))
                /* walk back down the stack looking for this node. */
                /* if it's not there, then the pli doesn't match. */
                for (frame=CURRENT_FRAME_INDEX, n_inversions=0;
                    !matches (node_item, frame);
                    --frame, n_inversions += HAS_INVERSION)
                {
                    if (frame == 0)
                        goto try_next_pli;
                }

/* Over here, all of the items in the node_list have been checked,
            /* and each one has had the while loop end in a match. So now
            /* we check the global stuff, and then declare success. */
            if ((n_inversions < pli->min_inversions)
                    || !device_matches (pli, frame))
                goto try_next_pli;

if (CURRENT_FRAME_INDEX - frame > ntv$v_pli_span_limit)
            {
                PRINT((ttt,"%%E - The PLI span= %d, exceeds user specifed (%d)",
                        CURRENT_FRAME_INDEX-frame, ntv$v_pli_span_limit));
                dump_dfs_stack(frame - 1);
                goto try_next_pli;
            }

*first_node_index = frame;
            /* When a false path exists, pruning in a DFS traverse will not
            /* work -- a non-worst-case timing on some node A can cause the
            /* worst-case timing on a downstream node B, if the worst-case
            /* timing on A is prevented from reaching B by a false path. Thus,
            /* we set the false_path_traced bit for each node the PLI spans.
            /* When the DFS sees this bit set, it doesn't prune. */
            for (i=frame; i<CURRENT_FRAME_INDEX; ++i)
                g$v_stack[i].node->false_path_traced = TRUE;
            return (TRUE);
        }
    try_next_pli: ;
    } return (FALSE);
}
```

Appendix B: Detailed Pseudocode

/* Copyright (c) 1992 by Digital Equipment Corporation, Maynard Mass*/ struct dfs_stack_item  g$v_stack[K$MAX_DEPTH];

PD92-0454Cont2

```
boolean FUNCTION false_path()
{
   IF top node of stack is the downstream node of a
"path_logically_impossible" pair
     AND the upstream node of the pair is somewhere in the stack
     THEN
          TRUE
       ELSE
          FALSE
}

DFS_propagate()
{
   pull in_node from the tope of g$v_stack.
   for each device connected to the in_node {
      out_node = the device's output node;
      if ( push( out_node, device ) )  {
         if (its a worst case ())
            DFS_propagate();
            pop_and_reset_bit ();
         }
      }
   }
}

/* We take every transition on a primary input and propagate it
as far as it can go.
** It makes no difference which order we process the inputs in --
   once they are all
**propagated, timing will be correct.  */
ntv$DFS_traversing()
{
   for every possible transition of a primary_input {
      push( primary_input, device-NULL );
      DFS_propagate();
      pop_and_reset_bit();
   }
}
{
   pull out_node from the top of the stack;
   pull in_node, in_trans from the next to top of stack;

/* calculate the device delay */
   device_delay = ntv$delay_model( top_of_stack.mos);
   out_arrival_time = in_trans.arrival_time + device_delay;
```

PLG 1/93
AMD.FRM

- 5 -

PD92-0454Cont2

```
   /* it is the worst case */
   trans := the transition owned by node having the latest
".arrival_time"
     if (out_arrival_time > old_out_arrival_time) {
        update worst_case arrival_time and predecessor;
        if(PREV__FRAME->unreal_transition)
           make_unreal_stack_real( CURRENT_FRAME_INDEX );
        return (TRUE);
     } else if(out_node->false_path_traced)  {
        /* If there's been a false path encompassing this node,
           then we propagate even if we're not the worst case
           because maybe this path can get to someplace
       downstream that the old path.  For memory efficiency,
          we don't make any transitions, but just set the
       unreal_transition attack bit.  If, at some point, we
          do become a worst-case, then we take all of the info
          on the stack and make real transitions out of them.
          /*
          COPY out transition INTO CURRENT_FRAME->old transition;
          CURRENT_FRAME->arrival time = out_arrival_time;
          CURRENT_FRAME=>unreal_transition = TRUE;
          return (TRUE);
     }
     return (FALSE);

}
{
   /* push info into the DFS_stack */
   ++g$v_depth;
   CURRENT_FRAME->node = node;
   CURRENT_FRAME->mos = device;
   false_p = false_path ( node );
   IF( NOT false_p )
      return TRUE;
   trans = the transition having latest arrival time, unless this
      is a primary input
   if( found such a trans ) {
      recover_old_stack_transitions( g$v_depth-1, trans )
   }
   return FALSE;
} make_unreal_stack_real (real_sp)
{
   for ( i=real_sp-1; g$v_stack [i].unreal_transition; --i )
```

PD92-0454Cont2

```
    {
      new = malloc( sizeof( struct transition ) );
      new->node := g$v_stack[i].node;
      new->arrival_time = g$v_stack [i].arrival time;
      new->predecessor - (i == 0) ? NULL :
g$v_stack[i=1].transition;
      g$v_stack [i].transition = new;
      g$v_stack [i+1].transition->predecessor = new;
      g$v_stack [i].unreal_transition = FALSE;
    }
}

/* Traverse the stack backwards, and follow it until the paths*/
/* diverge.  The common portion of (this path) and (the path  */
/* back from the old transition) is the stuff we've over-     */
/* written, and needs to be recreated.                        */ recover_old_stack_transitions (int bad_frame, struct transition
*bad tran)

{
   struct transition *new;
   int          i ;
      for(i=bad_frame-1; g$v_stack[i].node == bad_tran->predecessor-
>node; --i)

{
  if(i<0)
      DIE("%F --internal error -- PLI paths never diverge!");
/* If bad_tran points to another transition, then it actually */
/* points to this node, being traversed in an old phase/sense */
/* which should still be intact. */ if(bad_tran->predecessor != g$v_stack[i].transition)
   return;
/* If bad_tran could have come from the current stack trans-   */
/* ition, then we better not re-point it to the old transition */
/* (since that one is probably invalid by now). */ if(g$v_stack[i].arrival_time <= bad_tran-> arrival_time) {
   bad_tran->impossible_path_messup = TRUE;
   return;
} new=malloc( sizeof(struct transition));
new->node = bad_tran->predecessor.node;
```

PD92-0454Cont2

```
new->arrival_time = g$v_stack[i].old_transition.arrival_time;
new->predecessor = g$v_stack[i].old_transition.predecessor;
bad_tran->predecessor = new;
bad_tran = new;

/*We've backed up to a primary input, so we're done. */
if (bad_tran->predecessor == NULL)
   return;
   }
}
```

We claim:

1. A computer method for analyzing a directed graph which has a logic exclusivity path, the method comprising the steps of:

receiving at a computer information describing said logic exclusivity path, determining a true path parallel to said logic exclusivity path, and analyzing said directed graph by substituting said true path for said logic exclusivity path in said directed graph.

2. A computer method for improving design of a circuit through static analysis of a computer stored model of said circuit, said circuit having a logic exclusivity path, the method comprising the steps of:

receiving at a computer information describing said logic exclusivity path, determining a true path parallel to said logic exclusivity path, and analyzing said model of said circuit by substituting said true path for said logic exclusivity path during said analysis.

3. The method of claim 2 wherein said model of said circuit comprise a plurality of nodes, and wherein some of said nodes of said plurality have multiple transitions.

4. The method of claim 2 wherein the analyzing step comprises the steps of:

analyzing other paths in said model of said circuit parallel to said true path; and maintaining transitions of nodes in said other paths in a stack.

5. The method of claim 4 wherein said analyzing step further comprises substituting one of said other paths maintained in said stack as said true path in the event that it is determined that said true path is a logic exclusivity path.

6. The method of claim 2 wherein said analyzing step comprises a depth-first walk of said model.

7. The method of claim 2 wherein said logic exclusivity path is described by a user of said computer.

* * * * *